US008058387B2

(12) United States Patent
Chan et al.

(10) Patent No.: US 8,058,387 B2
(45) Date of Patent: *Nov. 15, 2011

(54) SOLUBLE POLYTHIOPHENE DERIVATIVES

(75) Inventors: Shu-Hua Chan, Miaoli County (TW);
Teng-Chih Chao, Pingjhen (TW);
Bao-Tsan Ko, Pingtung (TW);
Chih-Ping Chen, Kaohsiung County (TW); Chin-Sheng Lin, Tainan (TW);
Yi-Ling Chen, Chiayi County (TW);
Chao-Ying Yu, Kaohsiung (TW)

(73) Assignee: Industrial Technology Research Institute, Hsinchu County (TW)

( * ) Notice: Subject to any disclaimer, the term of this patent is extended or adjusted under 35 U.S.C. 154(b) by 27 days.

This patent is subject to a terminal disclaimer.

(21) Appl. No.: 12/412,651

(22) Filed: Mar. 27, 2009

(65) Prior Publication Data

US 2009/0299029 A1   Dec. 3, 2009

Related U.S. Application Data

(63) Continuation-in-part of application No. 12/130,917, filed on May 30, 2008, now Pat. No. 7,754,847.

(30) Foreign Application Priority Data

Dec. 22, 2008 (TW) ................................. 97150001 A

(51) Int. Cl.
*C08G 75/00* (2006.01)
(52) U.S. Cl. ....................................... 528/377; 528/380
(58) Field of Classification Search .................. 526/256; 528/377
See application file for complete search history.

(56) References Cited

FOREIGN PATENT DOCUMENTS

WO    2006/130717 A2    12/2006

OTHER PUBLICATIONS

Hong et al. (Polymer Preprints 2000, 41(1), 189).*
Muhlbacher et al., High Photovoltaic Performance of a Low-Bandgap Polymer, Adv. Mater. 2006, vol. 18, 2884-2889, Wiley-VCH Verlag GmbH, Weinheim.
Sirringhaus et al., High-resolution inkjet printing of all-polymer transistor circuits, Science, Dec. 15, 2000, vol. 290, 2123-2126.
Wong et al., Syntheses and Structures of Novel Heteroarene-Fused Coplanar pi-Conjugated Chromophores, Organic Letters, 2006, vol. 8, No. 22, 5033-5036.
Forster et al., "Conjugated Ladder Polymers Containing Thienylene Units", Macromolecules, vol. 32, No. 9, Apr. 10, 1999, pp. 3159-3162, ACS, Washington, DC, US.
Wong et al., "Syntheses and Structures of Novel Heteroarene-Fused Coplanar pi-Conjugated Chromophores", Organic Letters, vol. 8, No. 22, Sep. 28, 2006, pp. 5033-5036, ACS, Washington, DC, US.

(Continued)

*Primary Examiner* — James Seidleck
*Assistant Examiner* — Shane Fang
(74) *Attorney, Agent, or Firm* — Pai Patent & Trademark Law Firm; Chao-Chang David Pai

(57) ABSTRACT

The present invention discloses a soluble polythiophene derivative containing highly coplanar repeating units. The coplanar characteristic of the TPT (thiophene-phenylene - thiophene) units improves the degree of intramolecular conjugation and intermolecular π-π interaction. The polythiophene derivative exhibits good carrier mobility and is suitable for use in optoelectronic devices such as organic thin film transistors (OTFTs), organic light-emitting diodes (OLEDs), and organic solar cells (OSCs).

13 Claims, 6 Drawing Sheets

OTHER PUBLICATIONS

Second Examination Report and Citations issued by the Intellectual Property Office of the People's Repulic of China, on Dec. 14, 2010, for the counterpart application in the People's Republic of China (Appl. No. 200910001233.2).

Chan et al., "Synthesis, Characterization, and Photovoltaic Properties of Novel Semiconducting Polymers with Thiophene-Phenylene-Thiophene (TPT) as Coplanar Units", Macromolecules 2008, 41, 5519-5526, American Chemical Society.

* cited by examiner

SOLUBLE POLYTHIOPHENE DERIVATIVES

CROSS REFERENCE TO RELATED APPLICATIONS

This application is a Continuation-In-Part of U.S. patent application Ser. No. 12/130,917, filed May 30, 2008, the disclosure of which is hereby incorporated by reference herein in its entirety. This Application claims priority of Taiwan Patent Application No. 097150001 filed on Dec. 22, 2008, the entirety of which is incorporated by reference herein.

BACKGROUND OF THE INVENTION

1. Field of the Invention

The present invention relates to a soluble polythiophene derivative containing highly coplanar repeating units, and in particular relates to using the soluble thiophene derivative in optoelectronic devices.

2. Description of the Related Art

Recently, due to the fundamental semiconductor and optoelectronic properties of polymer semiconducting material, the material has attracted considerable research interest because of the potential for being used in optoelectronic devices such as organic thin film transistors (OTFTs), organic light-emitting diodes (OLEDs), and organic solar cells (OSCs) and being mass produced. In addition, with the active layer of the optoelectronic device being fabricated by printing technology, material having polymer properties can produce a flexible optoelectronic device with advantages of lightweight, low cost and large area fabrication.

The key development for polymer semiconducting material applicability is based on the soluble conjugated polymer. For the soluble conjugated polymer, a main chain is connected by a conjugated backbone, and the function of a side chain is to increase solubility. However, a main drawback for conjugated polymer applicability in optoelectronic devices is its low carrier mobility, consequently limiting the practicability of optoelectronic devices made with polymer semiconducting material. Therefore, one solution is to synthesize conjugated polymer with high carrier mobility materials to improve the efficiency of optoelectronic devices made from polymer semiconducting material.

For application of polymer semiconducting material by organic thin film transistors (OTFT), polythiophene with carrier mobility of $10^{-5}$ cm$^2$/Vs is first used as an active layer. Next, poly(3-hexylthiophene) (P3HT) and poly(9,9-dioctylfluoreneco-bithiophene)(F8T2) are sequentially synthesized, thus improving the carrier mobility of the OTFT device to $10^{-1} \sim 10^{-3}$ cm$^2$/Vs.

For application of polymer semiconducting material by organic solar cells (OSCs), the active layer must be made of high mobility materials that can effectively transport holes and electrons, respectively. Otherwise, if the electrons and holes recombine, the carrier function will disappear, thus reducing power conversion efficiency of the OSCs. In 1979, a solution having hetero-junction structure including an electron donor and an electron acceptor was proposed, which sparked development of OSCs. At the time, initial power conversion efficiency was about 1%. Afterwards, various polymer materials were synthesized to be used as electron donors material and C60 material was used as an electron acceptor material, such as poly[2-methoxy-5-(2'-ethylhexyloxy)-1,4-phenylenevinylene] (MEH-PPV) with C60, P3HT with PCBM, thus improving power conversion efficiency in the range of 4 to 5%. In 2006, D. Muhlbacher at al. proposed using PCPDTBT (poly[2,6]-(4,4-bis-(2-ethylhexyl)-4H-cyclopental[2,1-b;3,4-b']dithiophene)-alt-4,7-(2,1,3-benzothiadiazole) polymer with a low bandgap, which improved power conversion efficiency of the polymer with PC$_{71}$BM to 3.2%. (For further detail see D. Muhlbacher, M. Scharber, M. Morana, Z. Zhu, D. Waller, R. Gaudiana, C. Brabec, "High photovoltaic performance of a low-bandgap polymer", *Adv. Mater*, 18, pp. 2884-2889(2006))

The above-mentioned polymers such as P3HT F8T2 and PCPDTBT are polymerized by thiophene derivatives. For the polymers, the main chain is based on a planar conjugated thiophene derivative. Because of interaction between the side-chain molecules, the intermolecules π-π interaction and carrier mobility are improved.

In 2006, Ken-Tsung Wong. at al. synthesized TPT (thiophene-phenylene-thiophene) and applied the material as a light-emitting material. The TPT compound was almost coplanar, so it exhibited good intermolecules π-π interaction. (For further detail see K.-T Wong, T.-C. Chao, L.-C. Chi, Y.-Y. Chu, A. Balaiah, S.-F. Chiu, Y.-H. Liu, Y. Wang, "Syntheses and structures of novel heteroarene-fused coplanar π-conjugated chromophores", Org. Lett. 8, pp. 5033-5036 (2006))

From the above description, if coplanar conjugated polymer is synthesized, not only does intermolecules π-π interaction improve, but also carrier mobility will be increased.

BRIEF SUMMARY OF THE INVENTION

An object of the present invention is to provide a soluble polythiophene derivative containing highly coplanar repeating units. The coplanar characteristic of the TPT (thiophene-phenylene-thiophene) units improves the degree of intramolecular conjugation and intermolecular π-π interaction, further increasing carrier mobility.

The present invention provides a soluble polythiophene derivative containing coplanar repeating units, having the structure of formula (I) or (II):

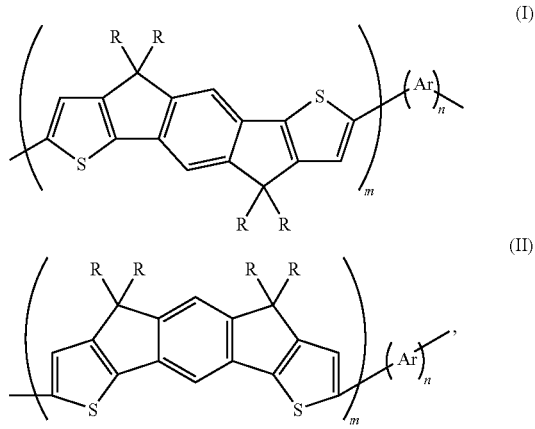

wherein R is hydrogen, alkyl, hydroxy, halogen, cyano (—CN), nitrous (—NO$_2$), amino, substituted or unsubstituted aryl, or substituted or unsubstituted heteroaryl, Ar is substituted or unsubstituted arylene or heteroarylene, and m and n are the numbers of repeating units, where m is an integer between 2 and 1000, and n is an integer between 0 and 100.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
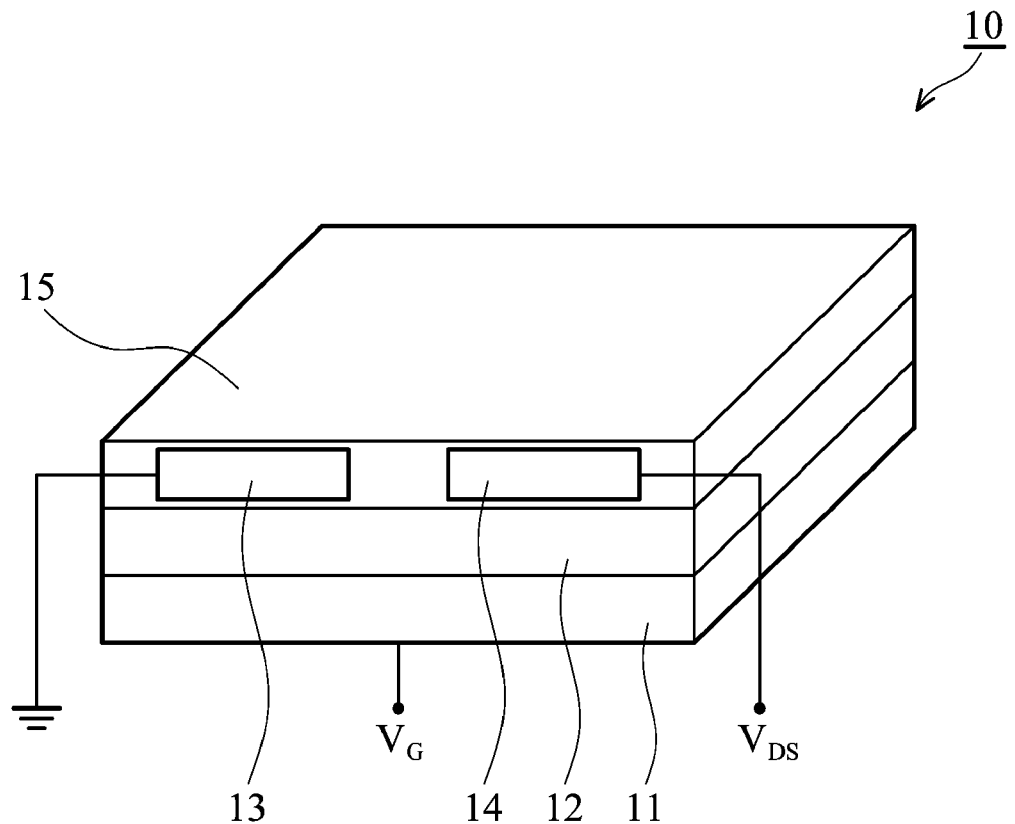
FIG. 1 is a bottom-contact organic thin-film transistor device.

The present invention provides a TPT or a long side-chain TPT as a monomer, and a suitable polymerization method to produce a coplanar polythiophene.

The present invention provides a soluble polythiophene derivative containing coplanar repeating units, having the structure of formula (I) or (II):

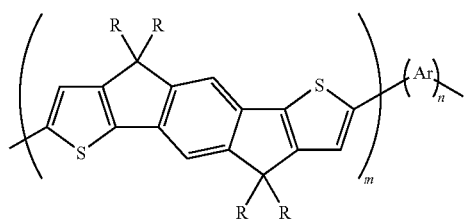

(I)

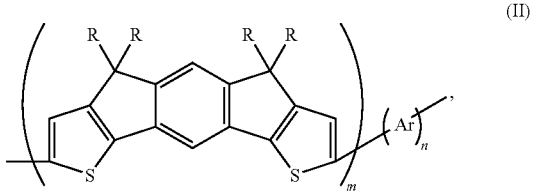

(II)

wherein R is hydrogen, alkyl, hydroxy, halogen, cyano (—CN), nitrous (—NO$_2$), amino, substituted or unsubstituted aryl, or substituted or unsubstituted heteroaryl, Ar is substituted or unsubstituted arylene or heteroarylene, and m and n are the numbers of repeating units, where m is an integer between 2 and 1000, n is an integer between 0 and 100.

The aryl comprises phenyl, naphthyl, diphenyl, anthryl, pyrenyl, phenanthryl or fluorene. Alternatively, the aryl may be other forms of polyphenyl diphenyl.

The heteroaryl comprises pyrane, pyrroline, furan, benzofuran, thiophene, benzothiophene, benzothiodiazole, pyridine, quinoline, isoquinoline, pyrazine, pyrimidine, pyrazole, imidazole, indole, thiazole, isothiazole, oxazole, isoxazole, benzothiazole, benzoxazole, 1,2,4-triazole, 1,2,3-triazole, phenanthroline, oxadiazolopyridine, pyridopyrazine, benzooxadiazole, thiadiazolopyridine, selenophene, thiadiazoloquinoxaline, thienopyrazine, quinoxaline or diketopyrrolopyrrole. Alternatively, the heteraryl may be other forms of heteroaromatic compound.

The arylene is divalent radical of the above aryl groups, and the heteroarylene is divalent radical of the above heteroaryl groups.

The soluble polythiophene derivative of formula (I) or (II) is copolymer (n>1) or homopolymer (n=0). In one embodiment, wherein R is phenyl or alkylphenyl, Ar is heteroarylene with sulfur atom, such as thiophene, dithiophene, benzothiodiazole (BT), thiadiazoloquinoxaline, thienopyrazine, quinoxaline or diketopyrrolopyrrole.

The table shows several representative compounds of the polythiophene

| No. | R | Ar | Structure |
|---|---|---|---|
| P6 | methyl-phenyl | 4,4'-bis(dodecyl)-2,2'-bithiophene | <br>P6 |

-continued
| No. | R | Ar | Structure |
|---|---|---|---|
| P8 | methyl-phenyl | 4,4'-bis(dodecyl)-2,2'-bithiophene | 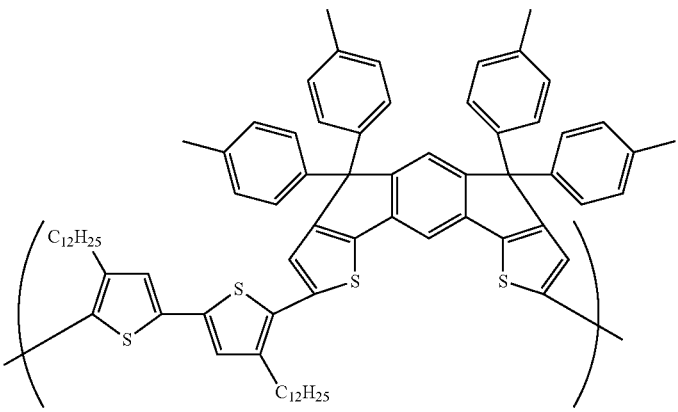 |
| P10 | hexyl-phenyl | none | 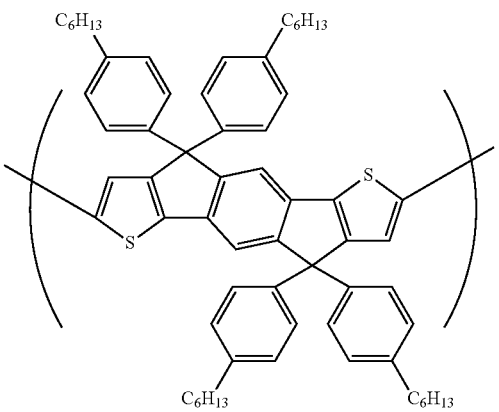 |
| P12 | hexyl-phenyl | thiophene | 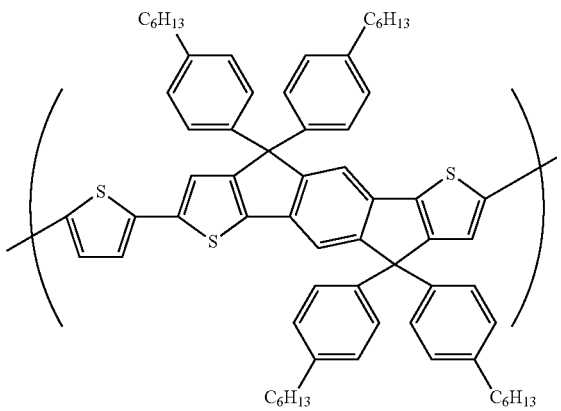 |

-continued

| No. | R | Ar | Structure |
|-----|---|-----|-----------|
| P14 | hexyl-phenyl | dithiophene | P14 |
| P16 | hexyl-phenyl | dithiophene, benzothiodiazole | P16 |
| P18 | hexyl-phenyl | thiophene, benzothiodiazole | P18 |

-continued
| No. | R | Ar | Structure |
|---|---|---|---|
| P25 | hexyl-phenyl | thiophene, 6,7-dihexyl [2,1,5]thiadiazolo[3,4 g] quinoxaline | 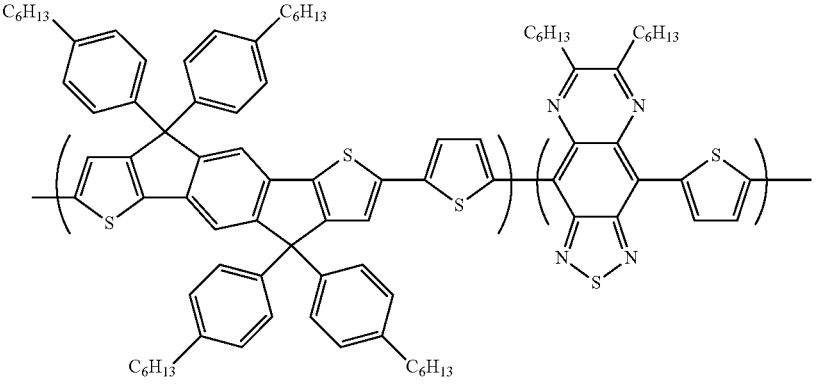 P25 |
| P27 | hexyl-phenyl | thiophene, 2,3-diphenylthieno[3,4-b] pyrazine) | 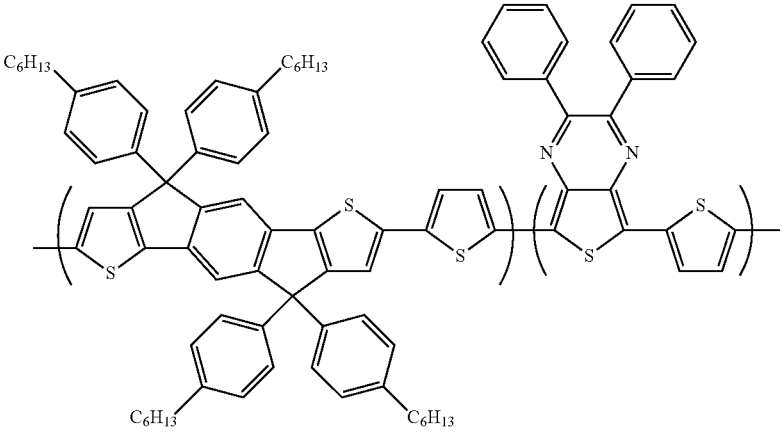 P27 |
| P29 | hexyl-phenyl | thiophene, 2,3-diphenylquinoxaline | 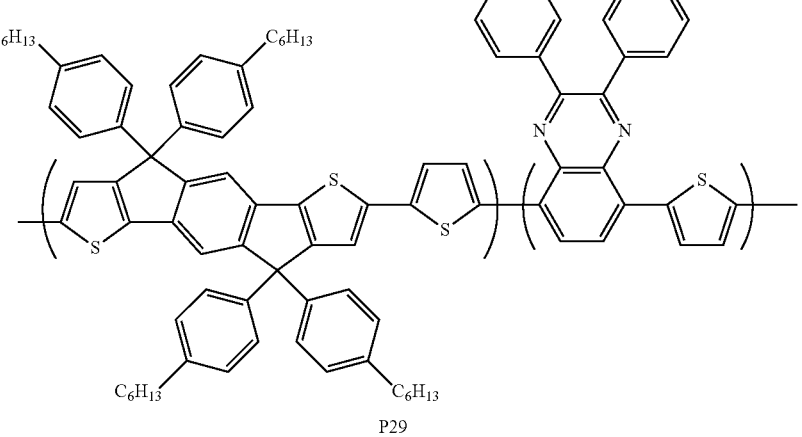 P29 |

| No. | R | Ar | Structure |
|---|---|---|---|
| P31 | hexyl-phenyl | thiophene 3,6-Bis-(thiophen-2-yl)-2,5-bis-(2-ethyl-hexyl) pyrrrolo[3,4-c]pyrrole-1,4-dione | (structure shown) P31 |

The molecular weight of the soluble polythiophene derivative is between 1000 and 1,000,000.

In one embodiment, for the synthesis of polythiophene homopolymer, the p-TPT or m-TPT was used as a reactant, Ni(COD), 1,5 cyclooctadiene and 2,2'-bipyridyl were used as a catalyst, and N,N-dimethylformamide and toluene were used as a solvent. The reaction was undertaken in $N_2$, and the preferable temperature was about 60~150° C. After filtering and purification, the homopolymer was obtained.

In one embodiment, for the synthesis of polythiophene copolymer, the p-TPT or m-TPT was used as a reactant and tris(dibenzylideneacetone)-dipalladium and tri(o-tolyl)phosphine were used as a catalyst. The mixture was dissolved in chlorobenzene. The polymer was synthesized by a Stille coupling reaction. After the degassed process, the mixture was put in a microwave reactor to polymerize. After filtering and purification, the copolymer was obtained.

The soluble polythiophene derivative is suitable to be used in optoelectronic devices, such as organic thin film transistors (OTFTs), organic light-emitting diodes (OLEDs), or organic solar cells (OSCs).

The soluble polythiophene derivative is suitable to be used as an active layer of organic thin film transistors (OTFTs). For further detailed configuration and preparation of an OTFT, see U.S. Pat. No. 6,107,117.

The soluble polythiophene derivative with carrier mobility was about $10^{-6}$~$10^{-1}$ when used in an OTFT. In one embodiment, the best carrier mobility was up to $3.02 \times 10^{-3}$. The carrier mobility was attributable to the TPT polymer being almost coplanar, thus consequently improving intramolecular conjugation, intermolecular π-π interaction and carrier mobility.

The soluble polythiophene derivative was used as an active layer of organic light-emitting diodes (OLEDs). For further detailed configuration and preparation of OLEDs, see U.S. Pat. No. 6,488,555.

The soluble polythiophene derivative was used as an active layer of organic solar cells (OSCs). For further detailed configuration and preparation of OSCs, see U.S. Pat. No. 6,852,920.

The active layer of OSCs contained the soluble polythiophene and an electron acceptor material, such as $PC_{61}BM$ or $PC_{71}BM$. In one embodiment, when the molar ratio of soluble polythiophene and an electron acceptor material was 1:3, the power conversion efficiency showed the best results.

When the soluble polythiophene derivative was used in OSCs, the performances of the OSCs were seen as follows: the power conversion efficiency was about 0.5%~3.3%, the open-circuit voltage was about 0.7~0.8 V, the short-circuit current was about 3~8 $mA/cm^2$, and the fill factor was about 0.4~0.6.

The following description is of the best-contemplated mode of carrying out the invention. This description is made for the purpose of illustrating the general principles of the invention and should not be taken in a limiting sense. The scope of the invention is best determined by reference to the appended claims.

PREPARATIVE EXAMPLES

Preparative Example 1

Synthesis of p-thiophene-phenylene-thiophene (S2)

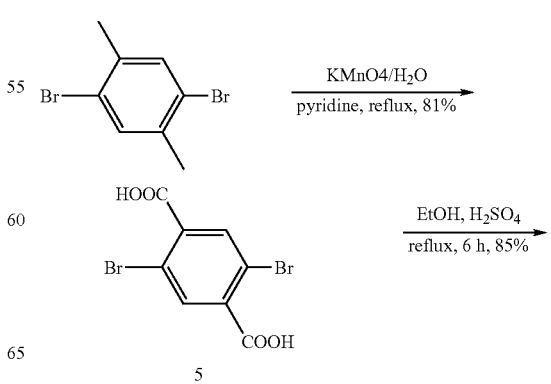

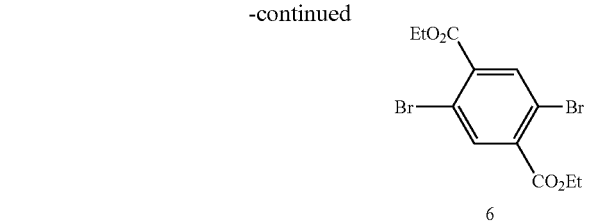

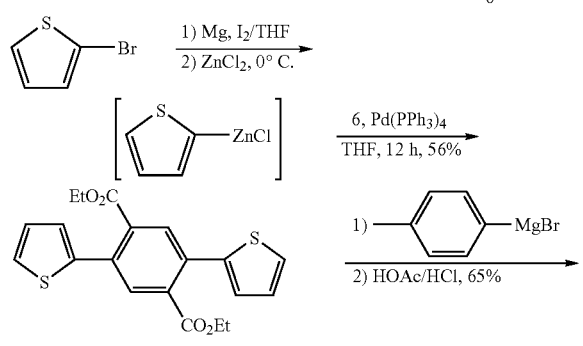

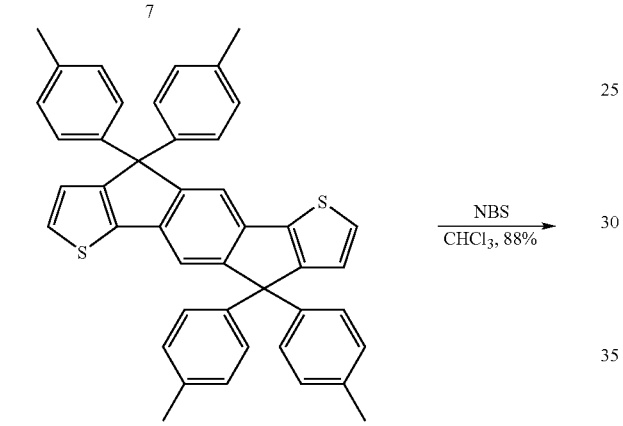

S2

Scheme 1 depicts the synthesis of compound S2 (p-TPT). Compound 8 was prepared by the synthetic method described in Org. Lett. 2006, 8, 5033-5036. 626 mg (1 mmol) of Compound 8 and 392 mg (2.2 mmol) of N-bromosuccinimide (NBS) were dissolved in 20 mL of chloroform in a 100 mL two-necked bottle. The bottle was wrapped by Al foil and kept under N₂ atmosphere overnight. The organic phase was extracted by a chloroform and saturated sodium chloride solution. Next, the organic phase was dried over anhydrous MgSO₄ and filtered. The filtrate was concentrated on a rotary evaporator. A pale yellow solid S2 was obtained after precipitation by methanol.

NMR data of the compound S2 was as follows.

$^1$H NMR (CDCl$_3$, 200 MHz) δ 2.29 (s, 12H), 6.94 (s, 2H), 7.05~7.12 (m, 16H), 7.29 (s, 2H).

Preparative Example 2

Synthesis of m-thiophene-phenylene-thiophene (S3)

Scheme 2

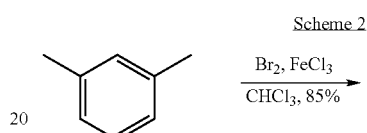

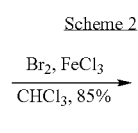

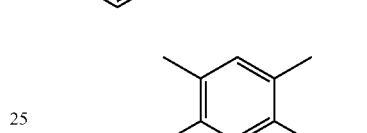

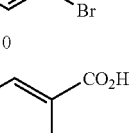

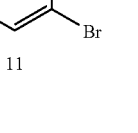

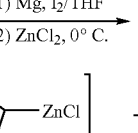

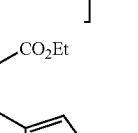

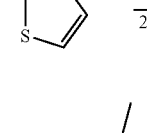

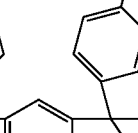

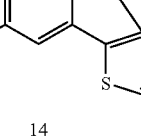

-continued

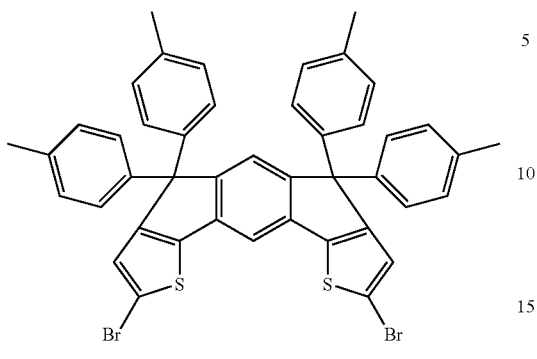

S3

Scheme 2 depicts the synthesis of compound S3 (m-TPT). Compound 14 was prepared by the synthetic method described in Org. Lett. 2006, 8, 5033-5036. A pale yellow solid S3 was obtained following the same procedure for preparing S2, except that compound 14 (626 mg) was used as a starting material. (690 mg, 88%)

NMR data of the compound S3 was as follows.

$^1$H NMR (CDCl$_3$, 200 MHz) δ 2.27 (s, 12H), 6.98~7.00 (m, 18H), 7.34 (s, 1H), 7.37 (s, 1H).

Preparative Example 3

Synthesis of Compound 18

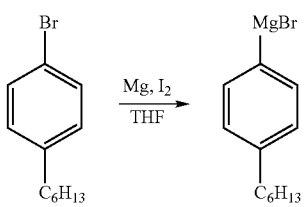

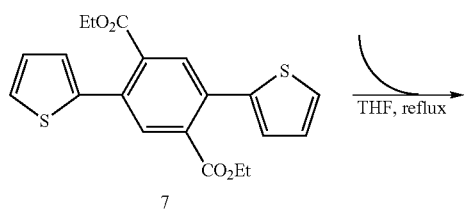

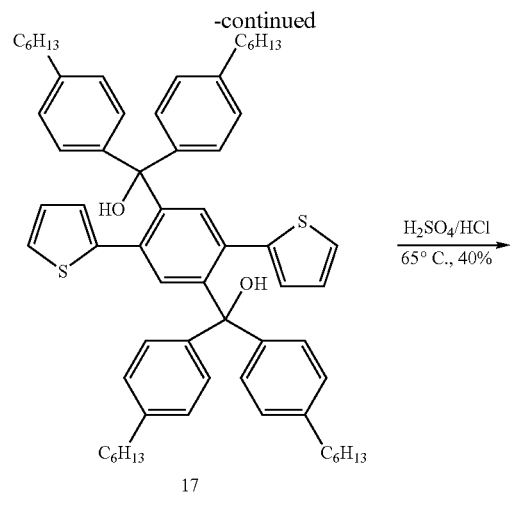

17

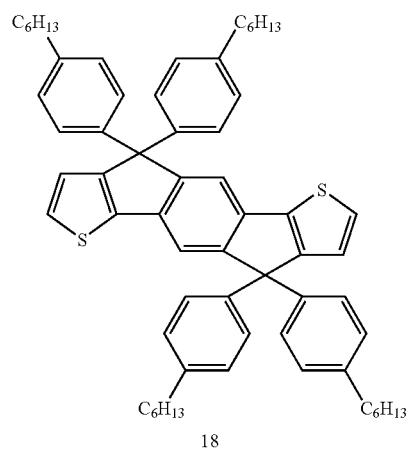

18

Scheme 3 depicts the synthesis of compound 18. Compound 7 was prepared by the synthetic method described in Org. Lett. 2006, 8, 5033-5036. 1.2 g of magnesium flakes and a small amount of I$_2$ were placed in a 250 mL two-necked bottle, equipped with a charging funnel and a reflux condenser. 50 μL of anhydrous tetrahydrofuran and 10.2 mL of 4-bromo-hexylbenzene were added to the charging funnel. Several droplets of the tetrahydrofuran and 4-bromo-hexylbenzene were first added to initiate the reaction, and then the remaining amount was added dropwise. After the addition was complete, the resulting mixture was heated to reflux. After the magnesium flakes completely disappeared, compound 7 was dissolved in anhydrous tetrahydrofuran and added to the charging funnel under reflux. After overnight reaction, the mixture was cooled to room temperature. The organic phase was extracted by an ethyl acetate and dried over anhydrous MgSO$_4$ and filtered. The filtrate was concentrated on a rotary evaporator to obtain a sticky yellow solid compound 17.

The above-mentioned sticky yellow liquid (compound 17) was placed in a 250 mL one-necked bottle, and then 100 mL of acetate acid was added. The solution was heated to 80° C. and 5 mL of sulfuric acid was slowly added. After four hours, the solution was cooled to room temperature. The solution was extracted by an ethyl acetate and dried over anhydrous MgSO$_4$ and filtered. The filtrate was concentrated on a rotary evaporator, and purified over silica gel chromatography (SiO$_2$, hexane) to give the yellow solid 18. (3.2 g, 42%)

NMR data of the compound 18 was as follows.

$^1$H NMR (CDCl$_3$, 200 MHz) δ 0.87 (t, J=6.6 Hz, 12H), 1.27~1.29 (m, 24H), 1.76 (m, 8H), 2.54 (t, J=8.0 Hz, 8H), 6.99 (d, J=5.2 Hz, 2H), 7.09 (dd, J=14.0, 8.0 Hz, 16H), 7.23 (d, J=4.8 Hz, 2H), 7.42 (s, 2H).

Preparative Example 4

Synthesis of compound S5

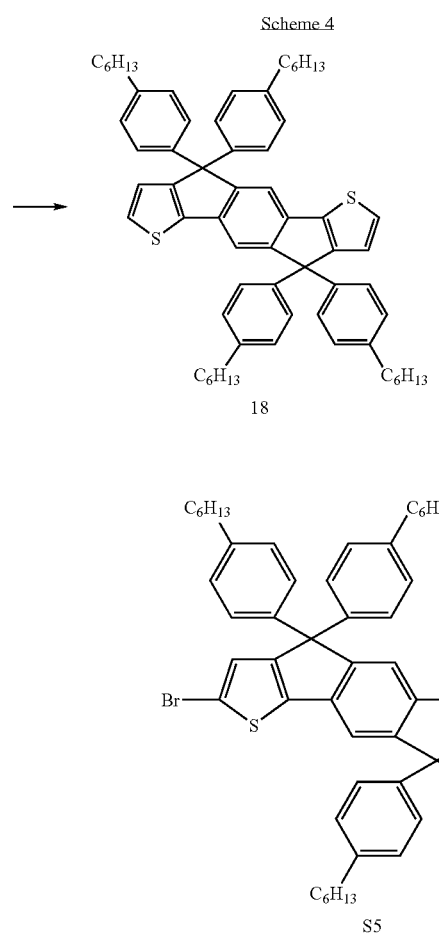

$^1$H NMR (CDCl$_3$, 200 MHz) δ 0.87 (t, J=6.6 Hz, 12H), 1.29 (m, 24H), 1.57 (m, 8H), 2.56 (t, J=8.0 Hz, 8H), 6.99 (s, 2H), 7.07~7.09 (m, 16H), 7.32 (s, 2H).

Preparative Example 5

Synthesis of Compound 23

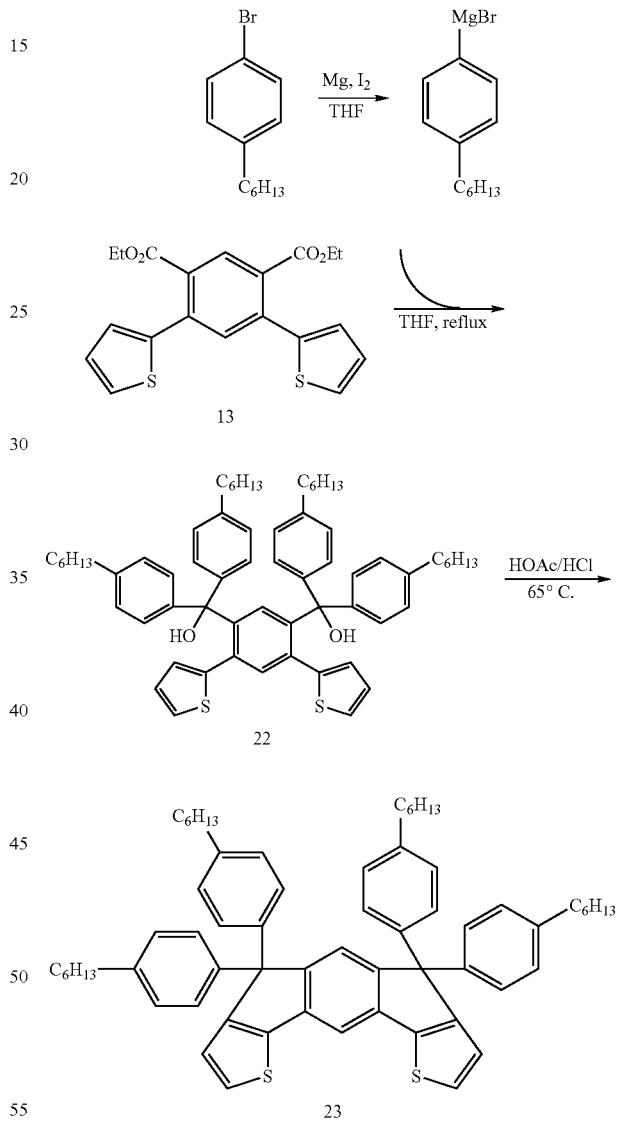

Scheme 4 depicts the synthesis of compound S5 (para-alkyl-thiophene-phenylene-thiophene, p-ATPT). 907 mg (1 mmol) of Compound 18 and 392 mg (2.2 mmol) of NBS were placed in a 100 mL two-necked bottle. 30 mL of chrolorm was added to the bottle. Then, the whole bottle was wrapped by Al foil and immersed into an ice bath. The mixed solution was under N$_2$ atmosphere overnight. The organic phase was extracted by a chloroform and saturated sodium chloride solution and then was dried over anhydrous MgSO$_4$ and filtered. The filtrate was concentrated on a rotary evaporator to obtain a pale yellow solid S5 (980 mg, yield: 92%) by methanol.

NMR data of the compound S5 was as follows.

Scheme 5 depicts the synthesis of compound 23. A pale yellow solid 23 (435 mg) was obtained following the same procedure for preparing compound 18, except that compound 13 was used as a reactant. (435 mg, 48%)

NMR data of the compound 23 was as follows.

$^1$H NMR (CDCl$_3$, 200 MHz) δ 0.84~0.91 (m, 12H), 1.28~1.35 (m, 24H), 1.54 (m, 8H), 2.52 (t, J=8.0 Hz, 8H), 6.93~7.08 (m, 18H), 7.28 (d, J=5.2 Hz, 2H), 7.39 (s, 1H), 7.52 (s, 1H).

Preparative Example 6

Synthesis of Compound S6

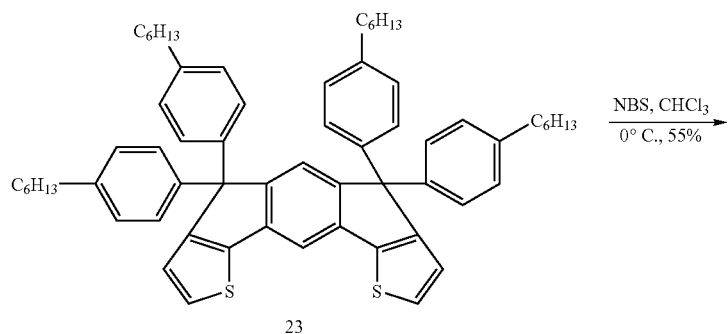

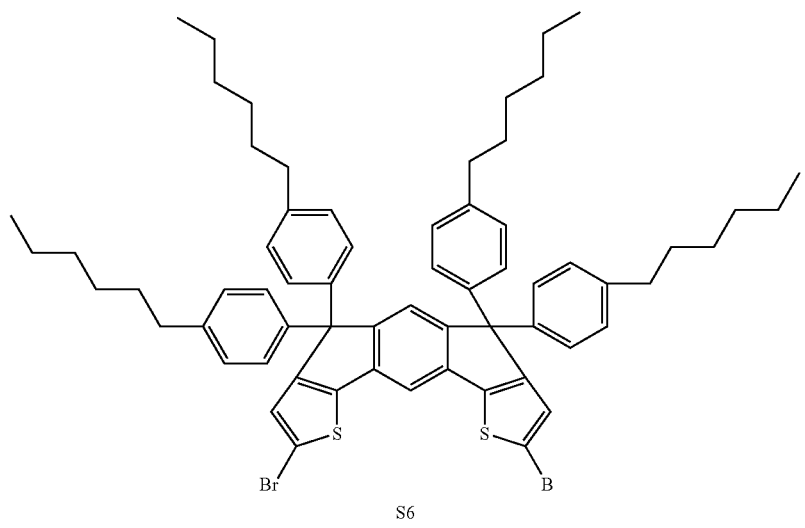

Scheme 6 depicts the synthesis of compound S6 (meta-alkyl-thiophene-phenylene-thiophene, m-ATPT). 907 mg (1 mmol) of Compound 23 and 392 mg (2.2 mmol) of NBS was placed in a 100 mL two-necked bottle. 30 mL of chrolorm was added to the bottle. Then, the whole bottle was wrapped by Al foil and immersed into an ice bath. The mixed solution was under $N_2$ atmosphere overnight. The organic phase was extracted by a chloroform and saturated sodium chloride solution and then was dried over anhydrous $MgSO_4$ and filtered. The filtrate was concentrated on a rotary evaporator to obtain a pale yellow solid S6 (586 mg, 55%) by methanol.

NMR data of the compound S6 was as follows.

$^1$H NMR (CDCl$_3$, 200 MHz) δ 0.84~0.91 (m, 12H), 1.28 (m, 24H), 1.54 (m, 8H), 2.51 (t, J=8.2 Hz, 8H), 6.93~7.03 (m, 18H), 7.28 (d, J=5.2 Hz, 2H), 7.34 (s, 1H), 7.37 (s, 1H).

EXAMPLE

Example 1

Synthesis of Polymer P6

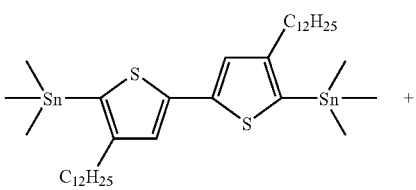

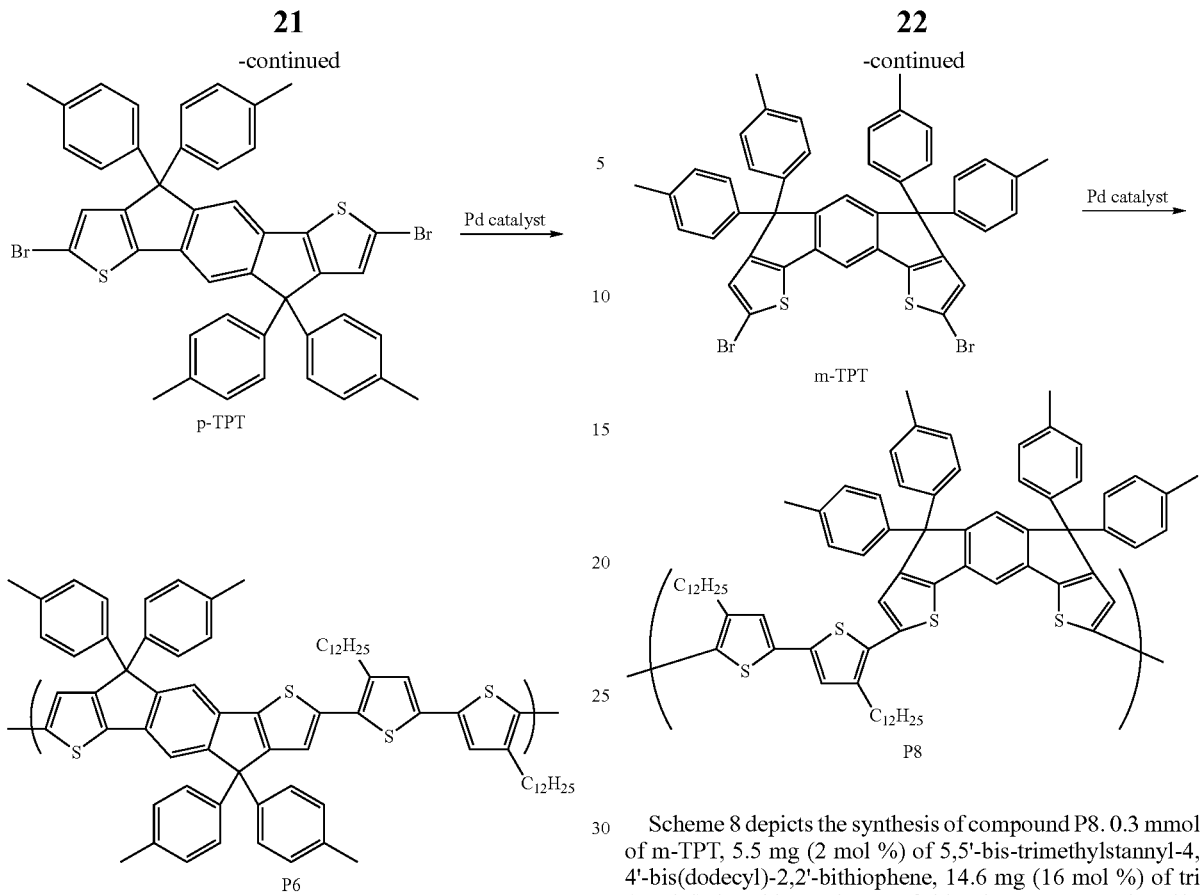

Scheme 7 depicts the synthesis of compound P6. 0.3 mmol of p-TPT, 5.5 mg (2 mol %) of 5,5'-bis-trimethylstanny 4,4'-bis(dodecyl)-2,2'-bithiophene, 14.6 mg (16 mol %) of tri(o-tolyl)phosphine and 5 mL of chlorobenzene were placed in a glass flask. After deoxygenation, the flask was placed in a microwave reactor (640 W, 30 min) for polymerization. After cooled to room temperature, the reaction mixture was added to methanol for precipitation. The polymer was filtered out and cleaned by using MeOH, acetone and hexane soxhelt extraction and chloroform was used to dissolve the polymer. Removal of the chloroform resulted in the polymer P6 (molecular weight: 25200 g/mol, $\lambda_{max}$=490 (film)).

Example 2

Synthesis of Polymer P8

Scheme 8

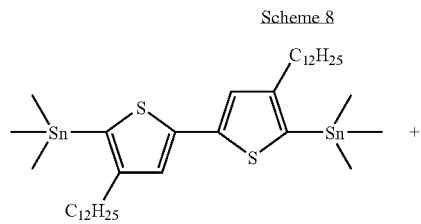

Scheme 8 depicts the synthesis of compound P8. 0.3 mmol of m-TPT, 5.5 mg (2 mol %) of 5,5'-bis-trimethylstannyl-4,4'-bis(dodecyl)-2,2'-bithiophene, 14.6 mg (16 mol %) of tri(o-tolyl)phosphine and 5 mL of chlorobenzene were placed in a glass flask. After deoxygenation, the flask was placed in a microwave reactor (640 W, 30 min) for polymerization. After cooled to room temperature, the reaction mixture was added to methanol for precipitation. The polymer was cleaned by using MeOH, acetone and hexane soxhelt extraction and chloroform was used to dissolve the polymer. Removal of the chloroform resulted in the polymer P8 (molecular weight: 16900 g/mol, $\lambda_{max}$=442 (film)).

Example 3

Synthesis of Polymer P10

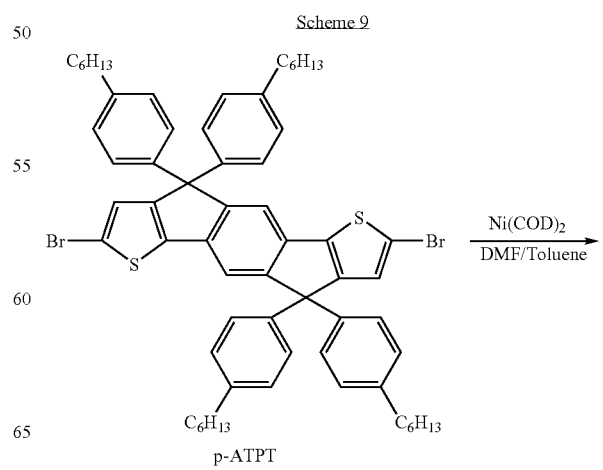

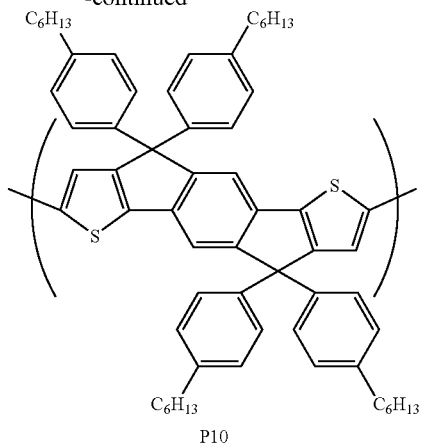

P10

Scheme 9 depicts the synthesis of compound P10. 1.6 mmol of p-ATPT, 1.9 mmol of Ni(COD), 0.35 mL of 1,5-cyclooctadiene, 1.9 mol of 2,2'-bipyridyl, 15 mL of N,N-dimethylformamide and 15 mL of toluene were placed in a 100 mL glass flask. The mixture was under $N_2$ atmosphere at 60° C. for 48 hours. After cooled to room temperature, the mixture was washed with a disodium ethylenediamineteraacetate solution twice and DI water twice, respectively. The mixture was added to methanol for precipitation. The solution was filtered out and cleaned by MeOH, acetone and hexane soxhelt extraction and chloroform was used to dissolve the polymer. Removal of the chloroform resulted in the polymer P10 (molecular weight: 21800 g/mol, $\lambda_{max}$=510 (film)).

Example 4

Synthesis of Polymer P12

Scheme 10

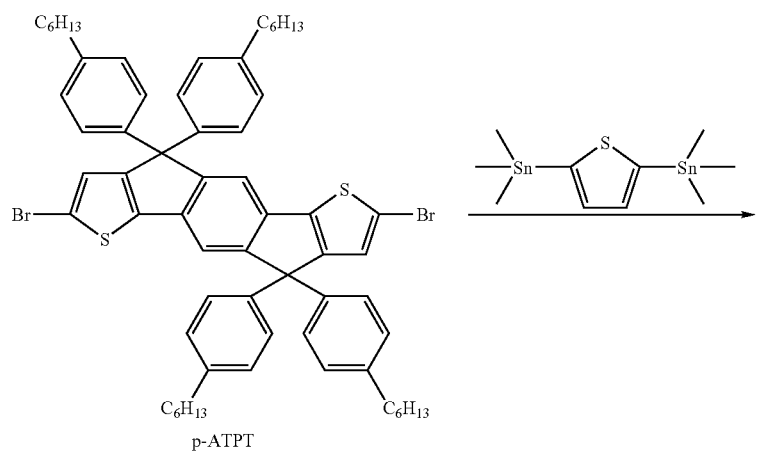

p-ATPT

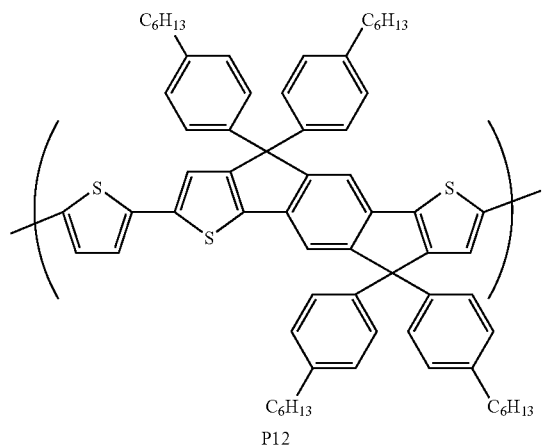

P12

Scheme 10 depicts the synthesis of compound P12. 0.3 mmol of p-ATPT, 5.5 mg (2 mol %) of 2,5-bis-trimethylstannylthiophene, 14.6 mg (16 mol %) of tri(o-tolyl)phosphine and 5 mL of chlorobenzene were placed in a glass flask. After deoxygenation, the flask was placed in a microwave reactor (640 W, 30 min) for polymerization. After cooled to room temperature, the reaction mixture was added to methanol for precipitation. The polymer was filtered out and cleaned by using MeOH, acetone and hexane soxhelt extraction and chloroform was used to dissolve the polymer. Removal of the chloroform resulted in the polymer P12 (molecular weight: 48700 g/mol, $\lambda_{max}$=510 (film)).

Example 5

Synthesis of Polymer P14

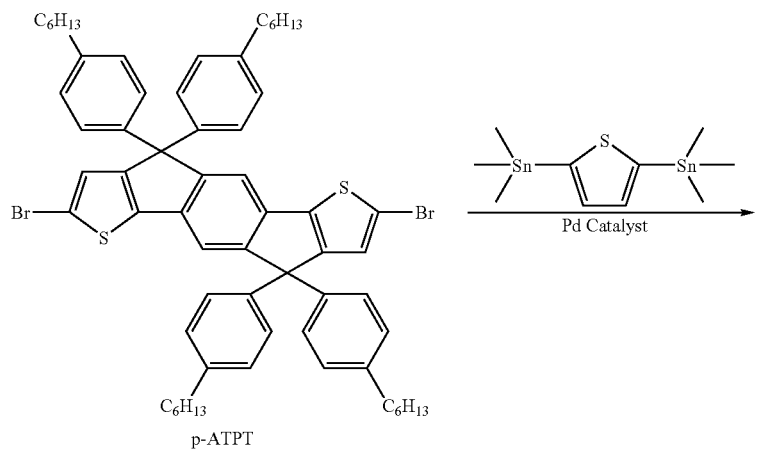

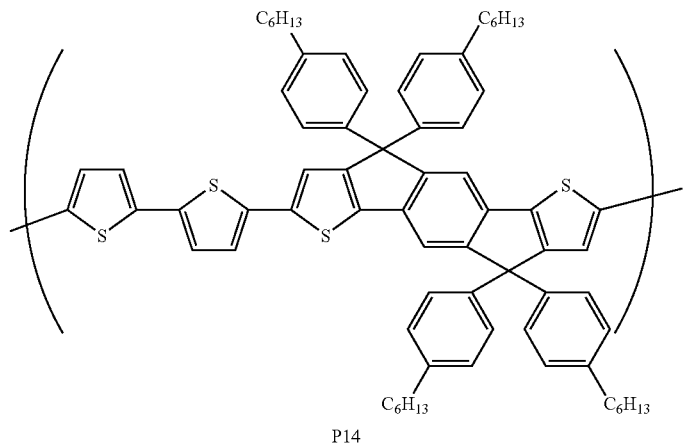

Scheme 11 depicts the synthesis of compound P14. 0.3 mmol of p-ATPT, 5.5 mg (2 mol %) of 2,5-bis-trimethylstannylthiophene, 14.6 mg (16 mol %) of tri(o-tolyl)phosphine and 5 mL of chlorobenzene were placed in a glass flask. After deoxygenation, the flask was placed in a microwave reactor (640 W, 30 min) for polymerization. After cooled to room temperature, the reaction mixture was added to methanol for precipitation. The polymer was filtered out and cleaned by using MeOH, acetone and hexane soxhelt extraction and chloroform was used to dissolve the polymer. Removal of the chloroform resulted in the polymer P14 (molecular weight: 29300 g/mol, $\lambda_{max}$=508 (film)).

Example 6

Synthesis of Polymer P16

Scheme 12 depicts the synthesis of compound P16. 0.15 mmol of p-ATPT, 0.3 mmol of 5,5'-bis-trimethylstannyl-2,2'-bithiophene, and 0.15 mmole of 4,7 bibromo-2,1,3 benzothiadiazole (BT) were as monomer and placed in a glass flask. 5.5 mg (2 mol %) of tris(dibenzylideneacetone)dipalladium, 14.6 mg (16 mol %) of tri(o-tolyl)phosphine and 5 mL of chlorobenzene were as catalyst. After deoxygenation, the flask was placed in a microwave reactor (640 W, 30 min) for polymerization. After cooled to room temperature, the traction mixture was added to methanol for precipitation. The polymer was filtered out and cleaned by using MeOH, acetone and hexane soxhelt extraction to obtain the polymer P16. (molecular weight: 26372 g/mol, $\lambda_{max}$=550 (film)).

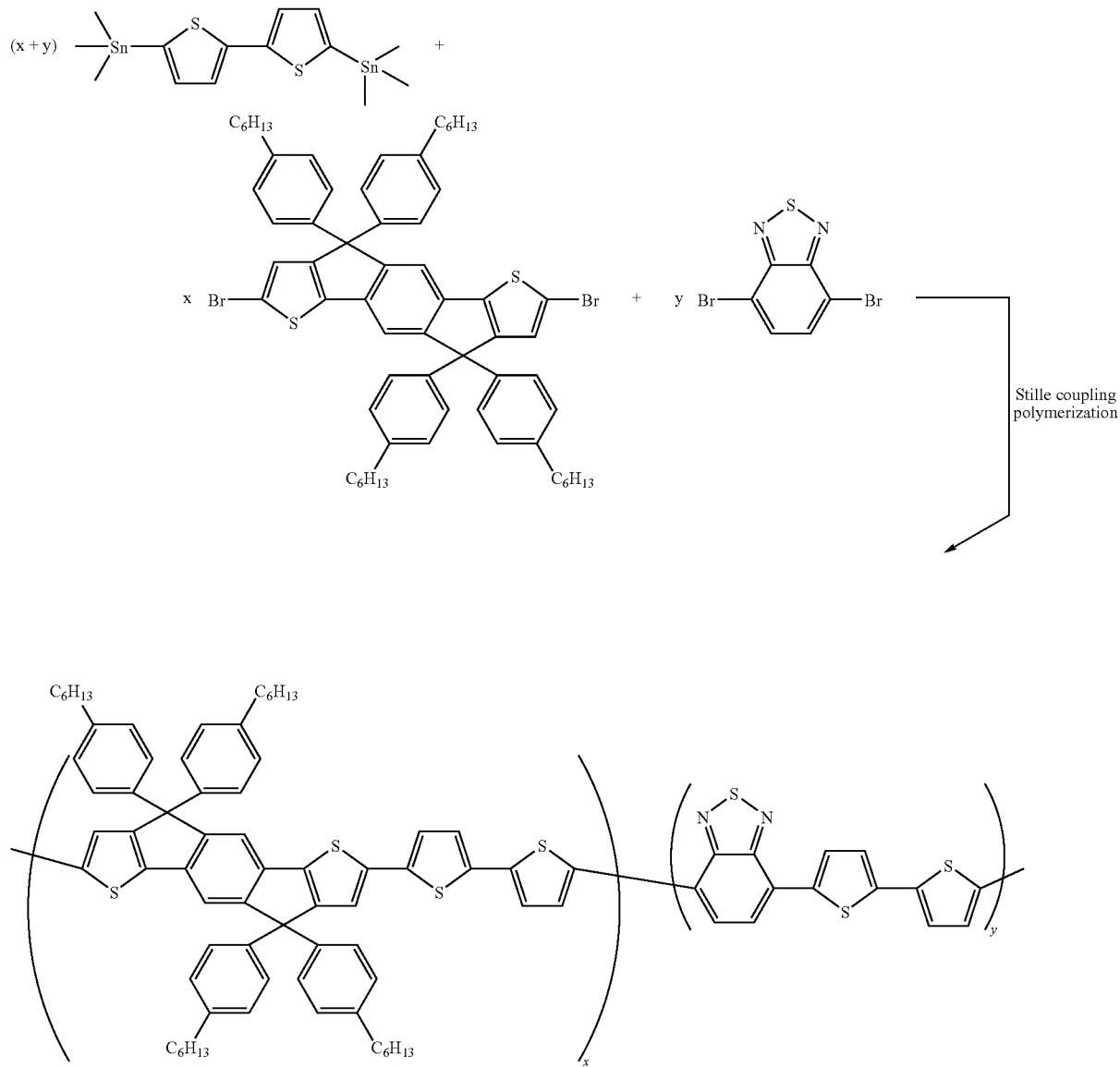

Scheme 12

Example 7

Synthesis of Polymer P18

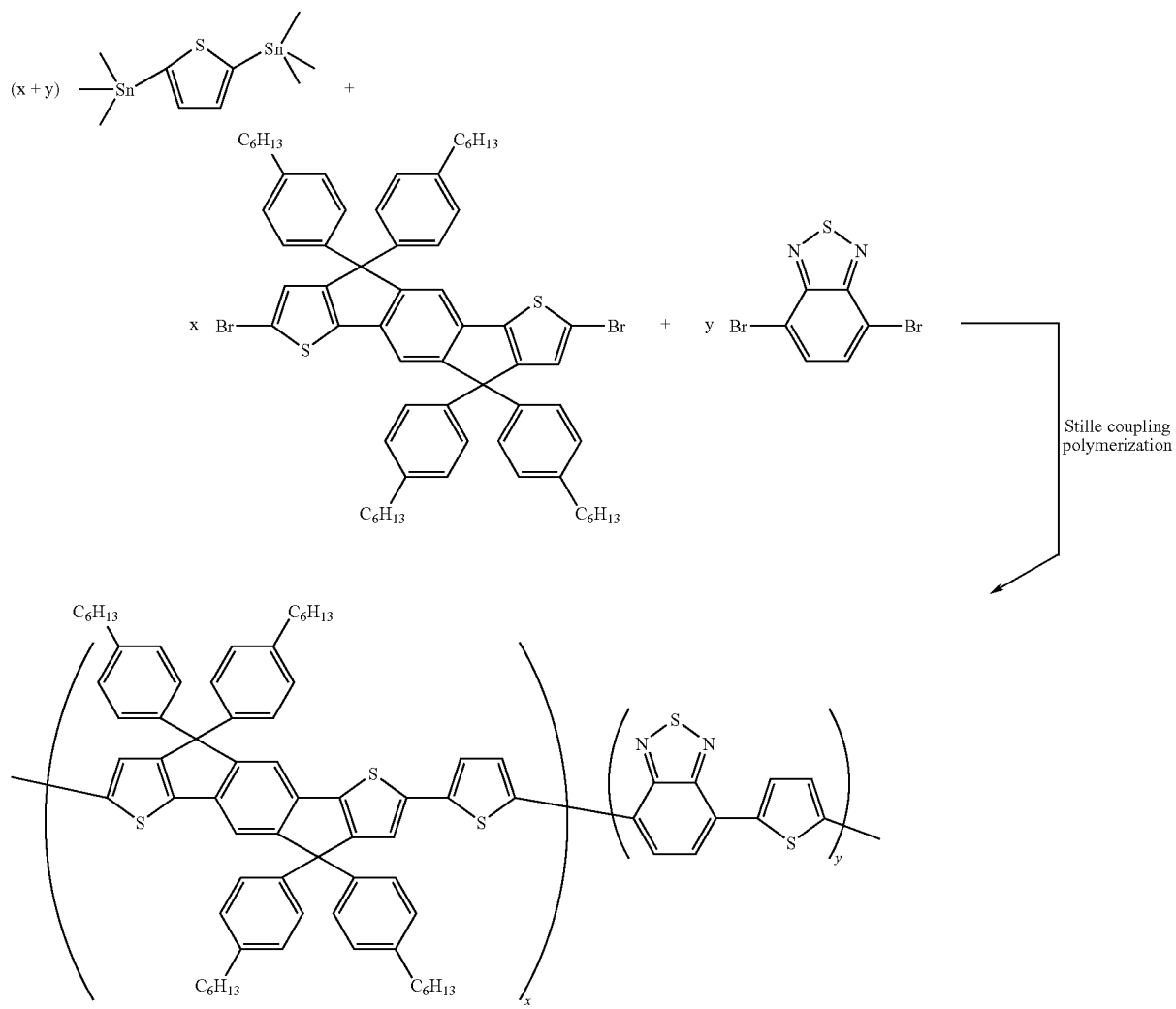

Scheme 13

Scheme 13 depicts the synthesis of compound P18. 0.15 mmol of p-ATPT, 0.3 mmol of 2,5-bis-trimethylstannylthiophene, and 0.15 mmole of 4,7 bibromo-2,1,3 benzothiadiazole (BT) were as monomer and placed in a glass flask. 5.5 mg (2 mol %) of tris(dibenzylideneacetone)dipalladium, 14.6 mg (16 mol %) of tri(o-tolyl)phosphine and 5 mL of chlorobenzene were as catalyst. After deoxygenation, the flask was placed in a microwave reactor (640 W, 30 min) for polymerization. After cooled to room temperature, the reaction mixture was added to methanol for precipitation. The solution was filtered out and cleaned by using MeOH, acetone and hexane soxhelt extraction to obtain the polymer P18. (molecular weight: 38650 g/mol, $\lambda_{max}$=559 (film)).

Example 8

Synthesis of Polymer P25

Scheme 14

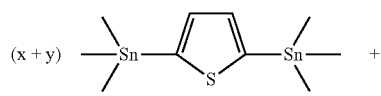

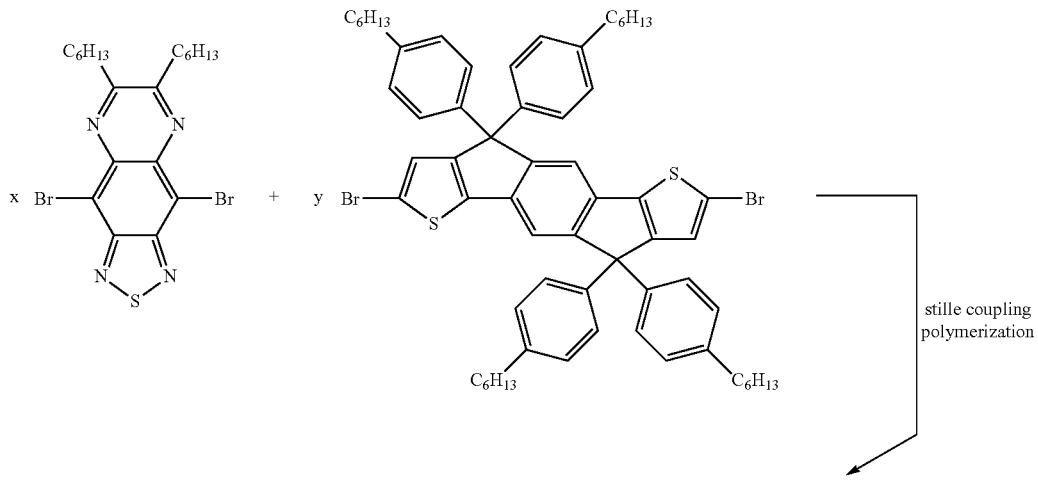

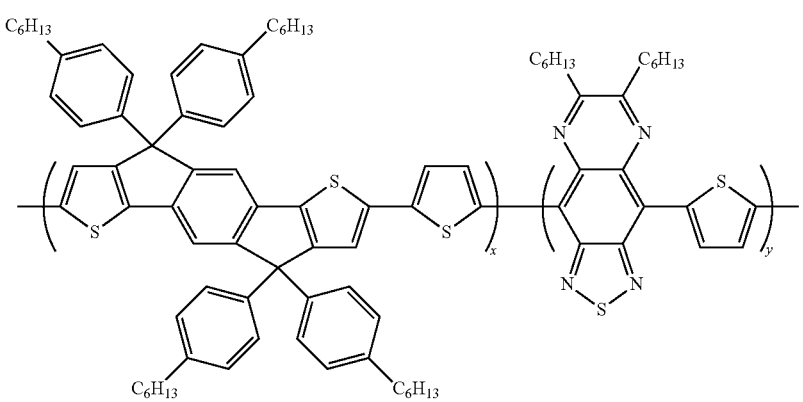

Scheme 14 depicts the synthesis of compound P25. 0.15 mmol of p-ATPT, 0.3 mmol of 2,5-bis-trimethylstannylthiophene, and 0.15 mmole of 6,7-dihexyl-4,9-dibromo[2,1,5]thiadiazolo[3,4g]quinoxaline(TQ) were as monomer and placed in a glass flask. 5.5 mg (2 mol %) of tris(dibenzylideneacetone)dipalladium, 14.6 mg (16 mol %) of tri(o-tolyl)phosphine and 10 mL of chlorobenzene were as catalyst. After deoxygenation, the flask was placed in a microwave reactor (640 W, 30 min) for polymerization. After cooled to room temperature, the reaction mixture was added to methanol for precipitation. The solution was filtered out and cleaned by using MeOH, acetone and hexane soxhelt extraction to obtain the polymer P25. ($\lambda_{onset}$=1179 nm (film)).

Example 9

Synthesis of Polymer P27

Scheme 15

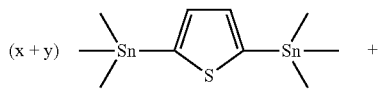

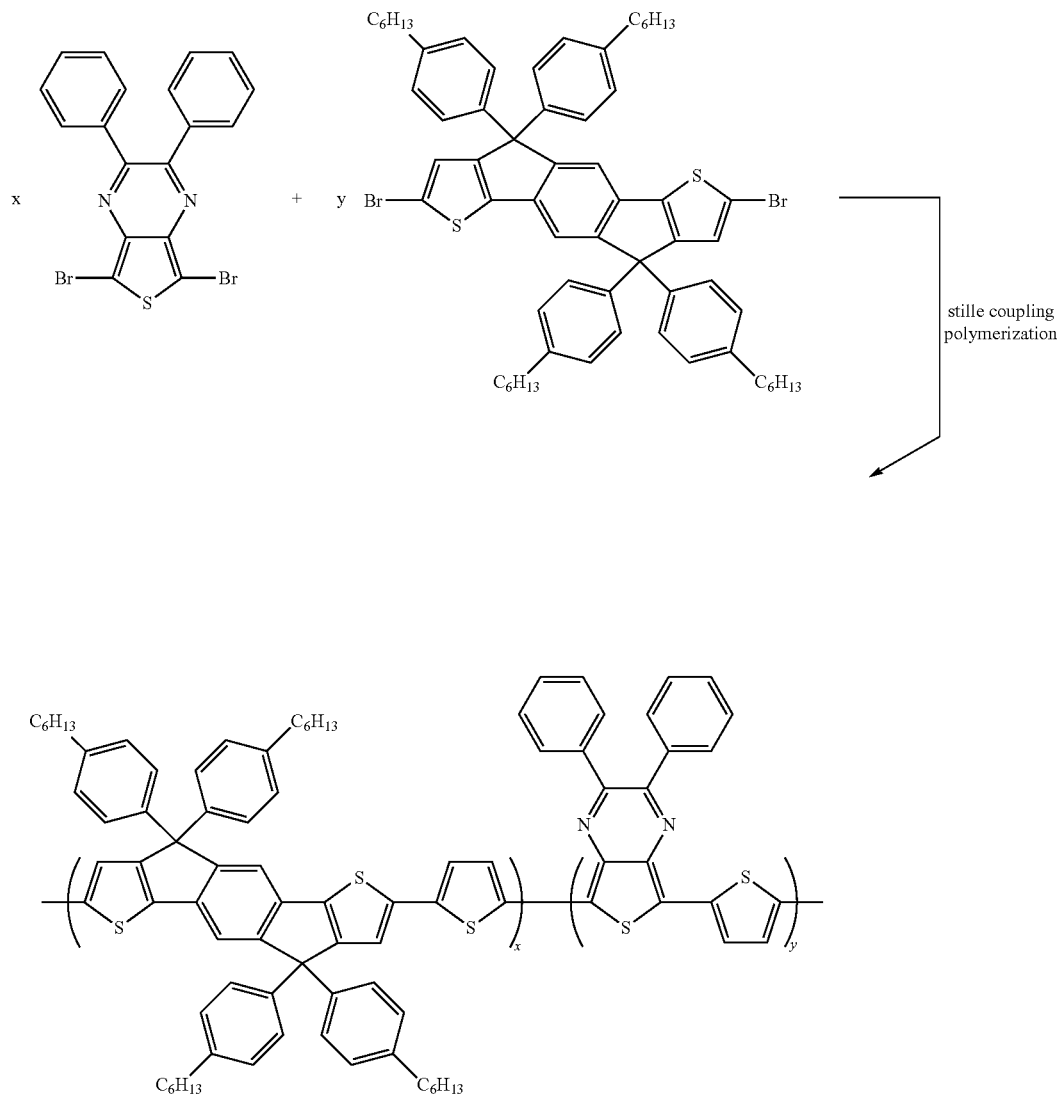

Scheme 15 depicts the synthesis of compound P27. 0.15 mmol of p-ATPT, 0.3 mmol of 2,5-bis-trimethylstannylthiophene, and 0.15 mmole of 5,7-dibromo-2,3-diphenylthieno[3,4-b]pyrazine (TP) were as monomer and placed in a glass flask. 5.5 mg (2 mol %) of tris(dibenzylideneacetone)dipalladium, 14.6 mg (16 mol %) of tri(o-tolyl)phosphine and 10 mL of chlorobenzene were as catalyst. After deoxygenation, the flask was placed in a microwave reactor (640 W, 30 min) for polymerization. After cooled to room temperature, the reaction mixture was added to methanol for precipitation. The solution was filtered out and cleaned by using MeOH, acetone and hexane soxhelt extraction to obtain the polymer P27. (molecular weight: 20056 g/mol, $\lambda_{onset}$=1170 (film)).

Example 10

Synthesis of Polymer P29

Scheme 16

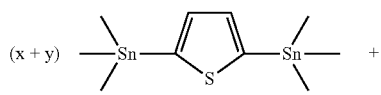

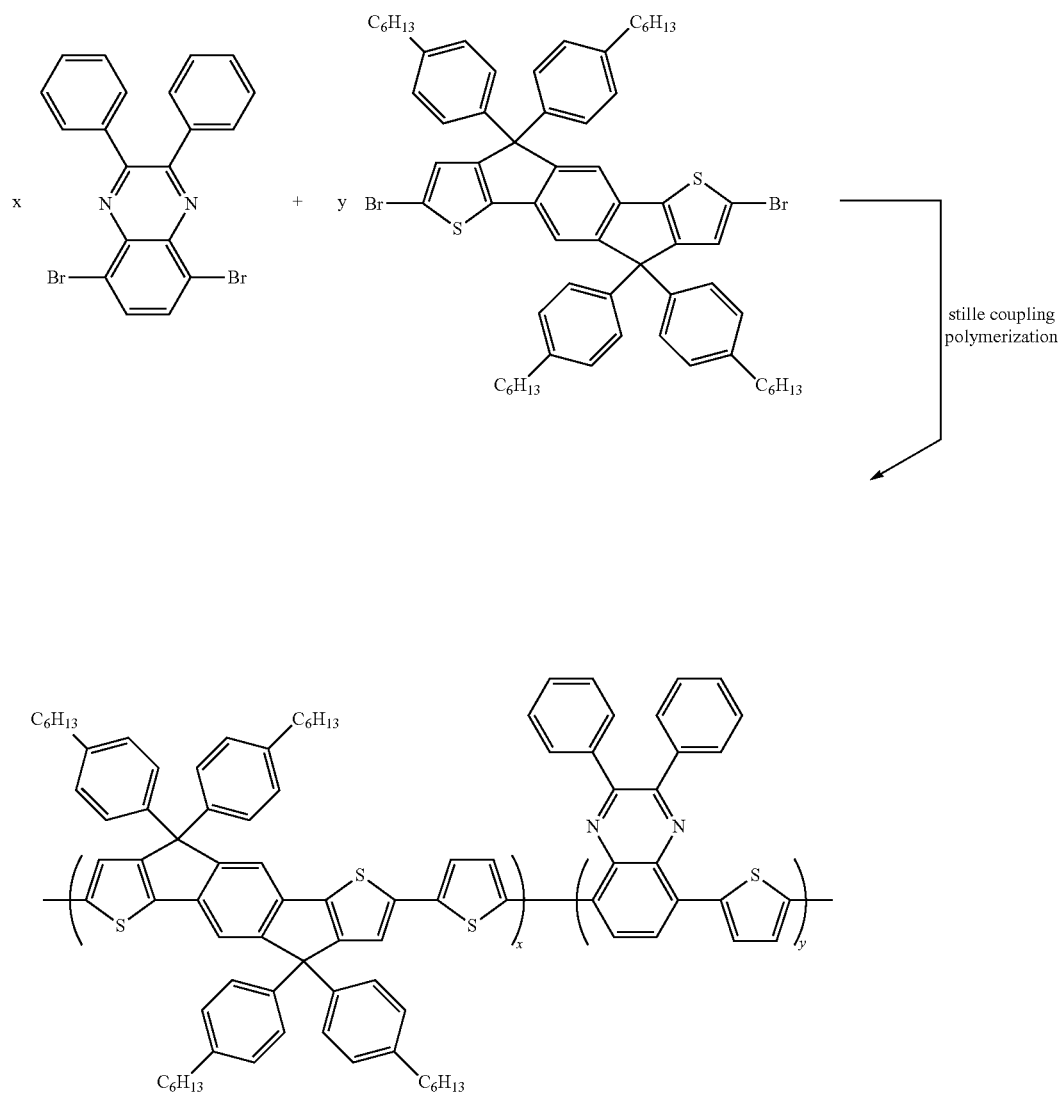

Scheme 16 depicts the synthesis of compound P29. 0.15 mmol of p-ATPT, mmol of 2,5-bis-trimethylstannylthiophene, and 0.15 mmole of 5,8-dibromo-2,3-diphenylquinoxaline were as monomer and placed in a glass flask. 5.5 mg (2 mol %) of tris(dibenzylideneacetone)dipalladium, 14.6 mg (16 mol %) of tri(o-tolyl)phosphine and 10 mL of chlorobenzene were as catalyst. After deoxygenation, the flask was placed in a microwave reactor (640 W, 30 min) for polymerization. After cooled to room temperature, the reaction mixture was added to methanol for precipitation. The solution was filtered out and cleaned by using MeOH, acetone and hexane soxhelt extraction to obtain the polymer P29. (molecular weight: 14229 g/mol, $\lambda_{onset}$=690 (film)).

Example 11

Synthesis of Polymer P31

Scheme 17

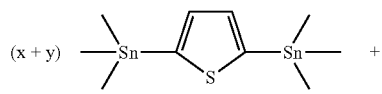

-continued

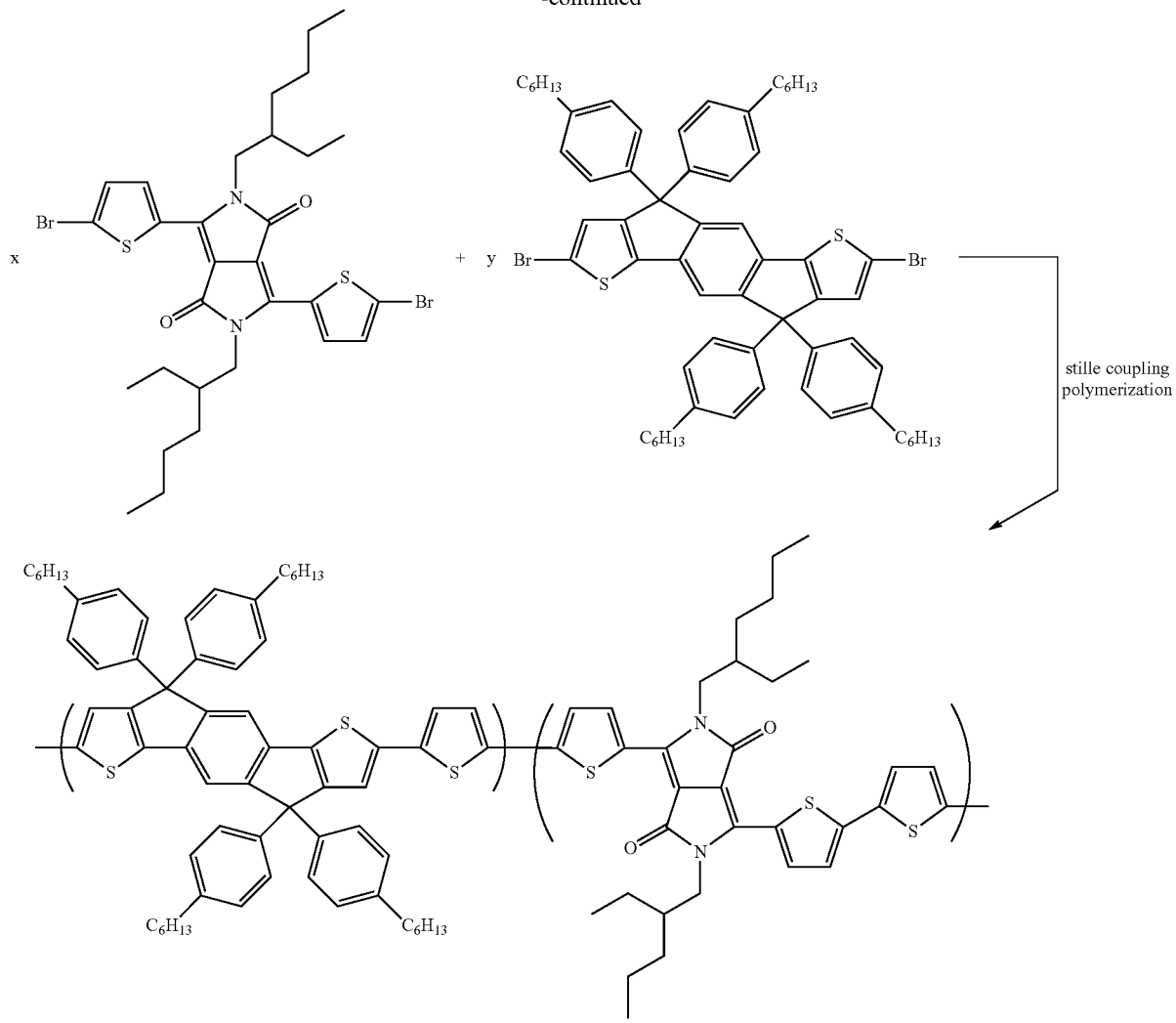

Scheme 17 depicts the synthesis of compound P31. 0.15 mmol of p-ATPT, 0.3 mmol of 2,5-bis-trimethylstannylthiophene, and 0.15 mmole of 3,6-bis -(5-bromo-thiophen-2-yl)-2,5-bis-(2-ethyl-hexyl)pyrrolo[3,4-c]pyrrole-1,4-dione were as monomer and placed in a glass flask. 5.5 mg (2 mol %) of tris(dibenzylideneacetone)dipalladium, 14.6 mg (16 mol %) of tri(o-tolyl)phosphine and 10 mL of chlorobenzene were as catalyst. After deoxygenation, the flask was placed in a microwave reactor (640 W, 30 min) for polymerization. After cooled to room temperature, the reaction mixture was added to methanol for precipitation. The solution was filtered out and cleaned by using MeOH, acetone and hexane soxhelt extraction to obtain the polymer P31. (molecular weight: 28589 g/mol, $\lambda_{onset}$=904 (film)).

Example 12

Organic Thin Film Transistor

FIG. 1 is a bottom-contact organic thin-film transistor device 10, which comprise: an $N^+$ type silicon wafer as a gate electrode 11; a silicon dioxide insulating layer 12, formed on the said gate electrode; a Pt wire as a source 13 and a drain electrode 14, formed on opposite sides of the insulating layer; an active layer 15, including the dissolved polythiophene derivative of the present invention, formed on the insulating layer. The width of the device was 1000 μm, the channel length between the source electrode and the drain electrode was 10 μm. The device was prepared as follows:

1. The patterned metal of the organic thin-film transistor 10 was cleaned as follows: sonicated with soap water for 30 minutes, cleaned with DI water, sonicated with DI water for 30 minutes, sonicated with acetone for 30 minutes, sonicated with isopropane for 30 minutes, dried over by $N_2$ gun, and reserved in desiccator in vacuum.

2. 1 wt % P14 solution was prepared in a dry box using chlorom, dichlorobenze (DCB) or tetraline as the solvents, and stirred overnight.

3. The transistor of step 1 was placed in a spin-coater. The solution of step 2 was filtered by a 0.45 μm filter plate. The solution of step 2 was uniformly coated on the transistor at a spin rate of 3000 rpm for 1 minute.

4. The coated transistor was taken out and vacuumed at 150° C. for 1 hour in a dark room. After cooled to room temperature, the transistor was wrapped by Al foil and reserved in a desiccator in vacuum for the next step.

5. The transistor was repeated measured for the electrical properties after time periods and observed for air-stability testing. The transistor was wrapped by Al foil and placed in a desiccator each time after the measurement.

Table 1 is experimental data of OTFTs containing the polymer of the present invention, including carrier mobility and on/off ratio.

| polymer | $\mu_h$(cm$^2$/Vs) | $I_{on}/I_{off}$ |
|---------|-----|-----|
| P6  | $3.72 \times 10^{-4}$ | $5.15 \times 10^3$ |
| P8  | $5.83 \times 10^{-6}$ | $1.59 \times 10^3$ |
| p10 | $1.45 \times 10^{-4}$ | $1.41 \times 10^4$ |
| P12 | $8.26 \times 10^{-4}$ | $9.10 \times 10^4$ |
| P14 | $3.02 \times 10^{-3}$ | $1.25 \times 10^6$ |

Figure 2:
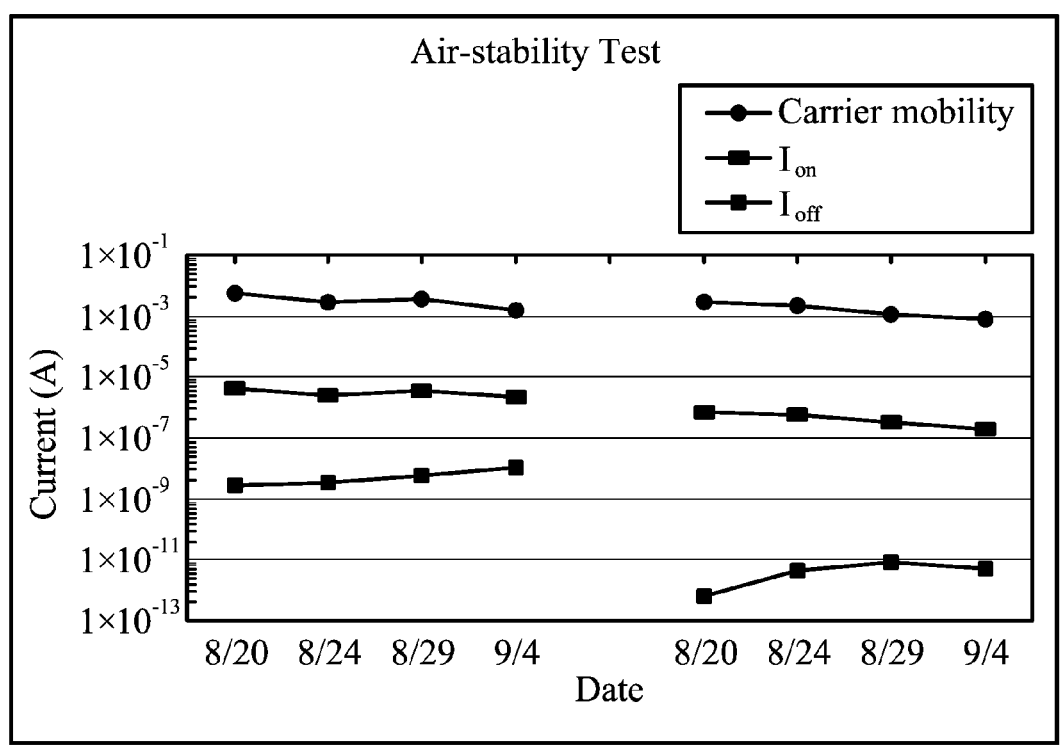
FIG. 2 is the carrier mobility and stability in air of the P14 and known P3HT

FIG. 2 is the carrier mobility and stability in air of the P14 and known P3HT. The initial carrier mobility of P3HT was $5.2 \times 10^{-3}$, and the on/off ratio was $1.4 \times 10^3$, after 16 days, the carrier mobility of P3HT became $1.7 \times 10^{-3}$, and the on/off ratio became $2.1 \times 10^2$. The initial carrier mobility of P14 was $3.0 \times 10^{-3}$, and the on/off ratio was $1.2 \times 10^5$, after 16 days, the carrier mobility of P14 became $8.1 \times 10^{-4}$, and the on/off ratio became $4.1 \times 10^4$. Comparing the data, the loss of the carrier mobility of polymer P14 was close to P3HT, and the $I_{on}/I_{off}$ in air was still larger than $10^4$, thus showing that the stability of P14 was better than P3HT.

Example 13

Organic Solar Cell

Figure 3:
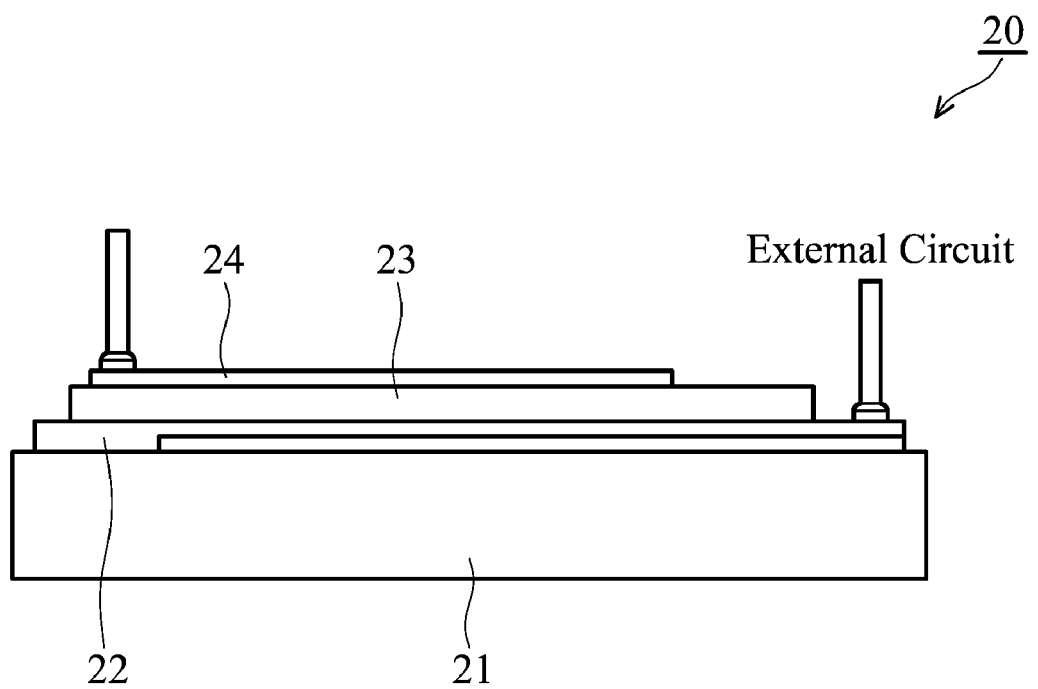
FIG. 3 is the device of the organic solar cell.

FIG. 3 is an organic solar cell device, which comprise: an ITO anode 21; a PEDOT:PSS (Poly(3,4-ethylenedioxythiophene):poly(styrene-sulfonate)) layer as hole transporting layer 22, formed on the anode; an active layer 23, including the dissolved polythiophene derivatives of the present invention, formed on the hole transporting layer; and a Ca/Al as a cathode 24.

The above-mentioned active layer was composed by the polymer of the present invention and [6,6]-phenyl-C-butyric acid methyl ester (PCBM). The polymer and PCBM was mixed by the ratio of 1:3. The fullerene cluster in PCBM can be C61 or C71. The cell was measured under AM1.5G. The device was prepared as follows:

1. The solution of active layer was prepared and stirred overnight.
2. The ITO glass was sonicated with acetone and isopropane for 15 minutes, respectively. Then, the ITO glass was dried by N$_2$ and placed in hot plate for 5 minutes.
3. The ITO glass was placed in oxygen plasma for 5 minutes.
4. PEDOT:PSS (Baytron P-VP AI4083) was coated on the ITO glass by spin coating with the rate of 3000 rpm/30 sec. Then, the ITO glass was baked in a dry box at 150° C. for one hour.
5. The ITO glass was then coated on Polymer/PCBM(1:3, w:w) in a dry box with the rate of 1000 rpm/60 sec.
6. The ITO glass was annealed on a hot plate at 140° C. for 20 minutes and left standing for cooling.
7. A mask was placed on the ITO glass and a Ca/Al electrode was deposited by evaporation.
8. Finally, the device was packaged to measure the I-V.

Table 2 shows the power conversion efficiency, short-circuit current, open-circuit voltage and fill factor of polymer P6, P12, and P14. The power conversion efficiency of the P12/PC$_{71}$BM and P14/PC$_{71}$BM were 3.28% and 2.69%, respectively. Among the three polymers, the P12/PC$_{71}$BM had the best performance with a short-circuit current of 7.48 mA/cm$^2$ and an open-circuit voltage of 0.80 V. Other than P6/PC$_{61}$BM, the fill factor for the others was about 0.5.

TABLE 2

| active layer | power conversion efficiency(%) | short-circuit current (mA/cm$^2$) | open-circuit voltage (V) | fill factor |
|---|---|---|---|---|
| P6/PC$_{61}$BM  | 1.08 | 3.49 | 0.792 | 0.392 |
| P10/PC$_{61}$BM | 0.58 | 1.40 | 0.760 | 0.540 |
| P12/PC$_{61}$BM | 2.16 | 5.28 | 0.766 | 0.533 |
| P12/PC$_{71}$BM | 3.28 | 7.48 | 0.800 | 0.548 |
| P14/PC$_{61}$BM | 1.67 | 4.55 | 0.759 | 0.485 |
| P14/PC$_{71}$BM | 2.69 | 6.97 | 0.790 | 0.485 |

Figure 4:
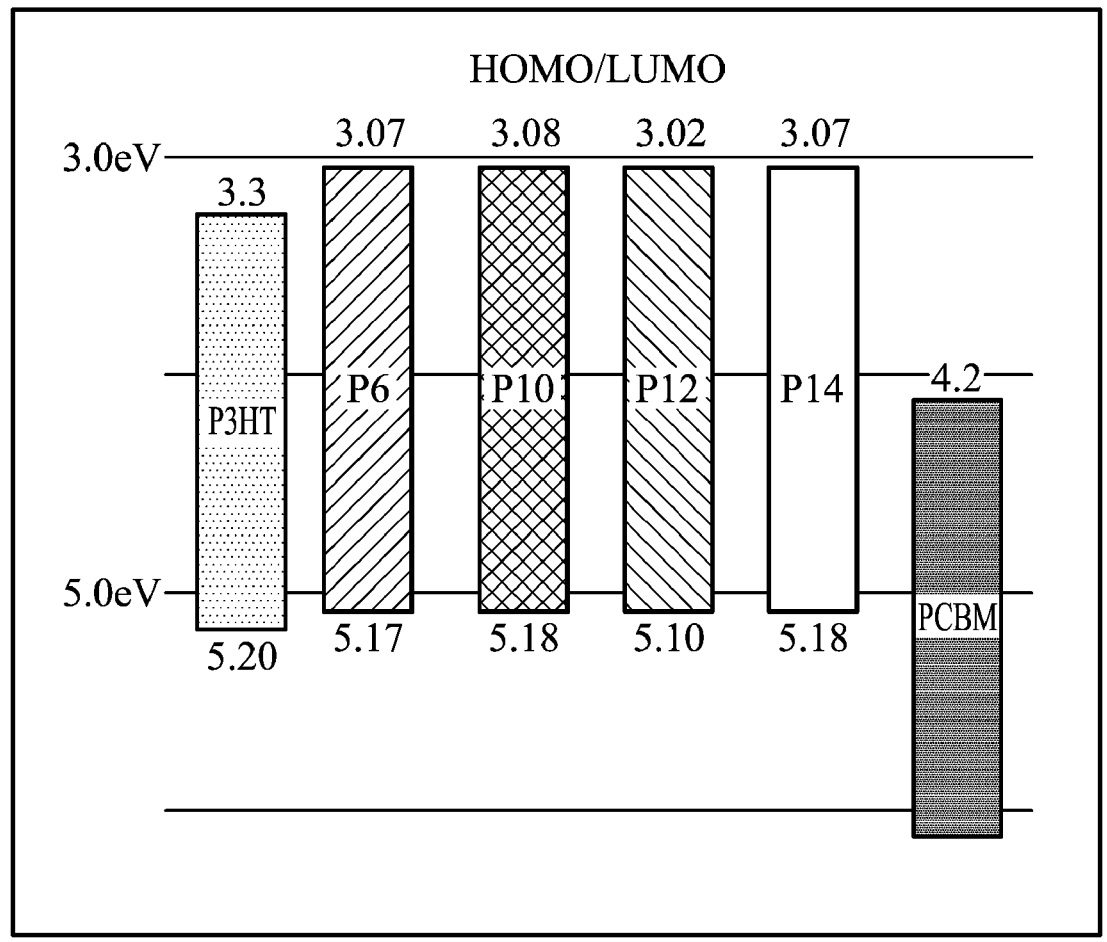
FIG. 4 is the HOMO (highest occupied molecular orbit) and LUMO (lowest unoccupied molecular orbit) energy level of the present invention and known P3HT and PCBM.

FIG. 4 is the HOMO (highest occupied molecular orbit) and LUMO (lowest unoccupied molecular orbit) energy level of the present invention and known P3HT and PCBM. The energy band gap of the polymer of the present invention was about 2.08~2.11 V and the HOMO and LUMO of polymers matched with those of PCBM, which indicated that the polymers were suitable as electron donor materials. The right side of the figure is the energy level of PCBM, which is the known electron acceptor material.

Figure 5:
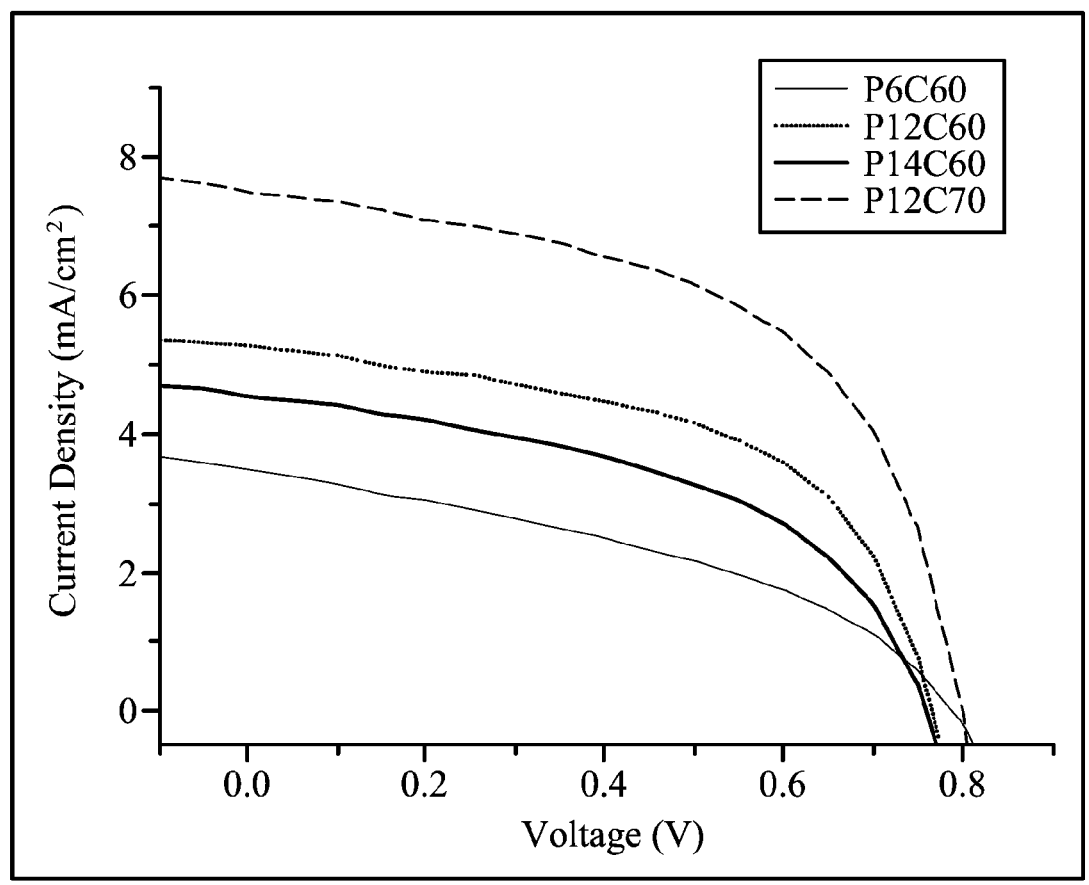
FIG. 5 is the current density vs. voltage of polymer of the present invention with PCBM.

FIG. 5 is the current density vs. voltage of polymer of the present invention with PCBM. The P12C70 had a highest current density of 7.48 mA/cm$^2$, and the P6C60 had a lowest current density of 3.49 mA/cm$^2$.

Comparative Example 1

An organic solar cell as in Example 9 was prepared by using P3HT:PCBM as the active layer and PEDOT:PSS/AI4083 (IIC Stack) as the hole transporting material. The power conversion efficiency was measured on a daily basis.

Comparative Example 2

An organic solar cell as in Example 9 was prepared by using P3HT:PCBM as an active layer and PEDOT:PSS/Bytron P (HC Stack) as the hole transporting material. The power conversion efficiency was measured on a daily basis.

Figure 6:
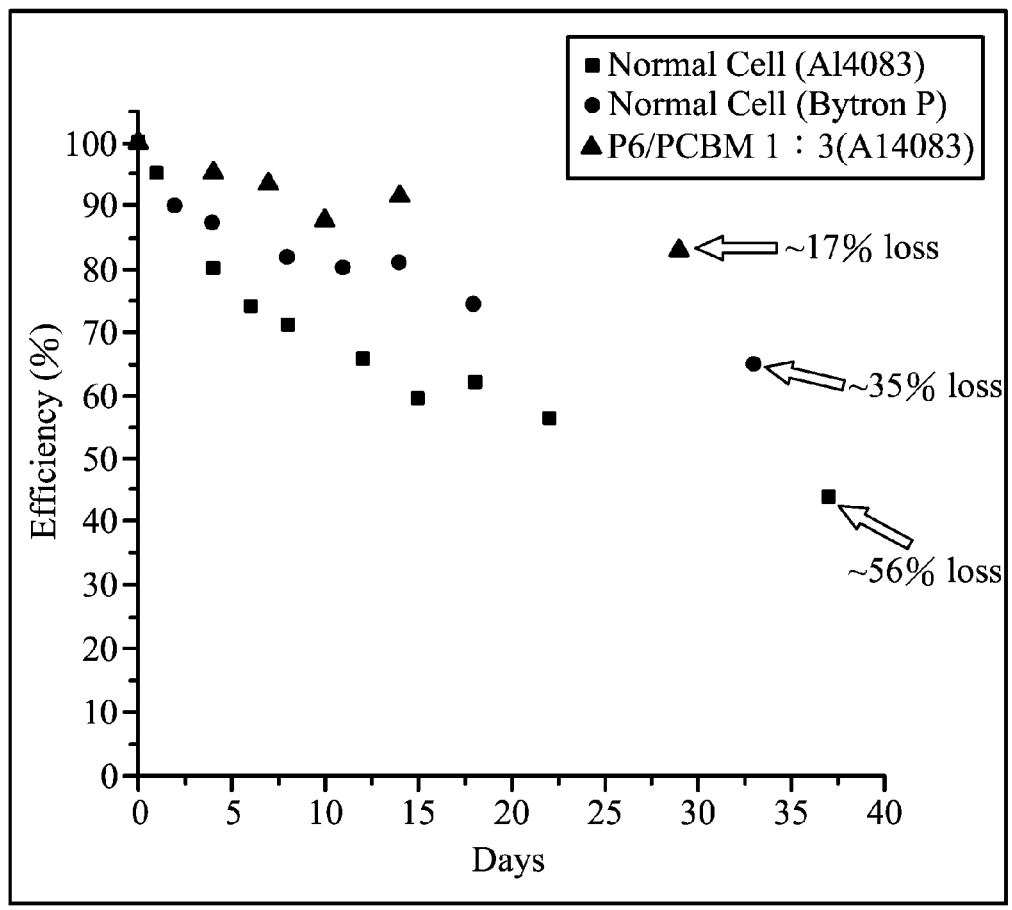
FIG. 6 is the stability in air of the polymer of the present invention and other cells.

FIG. 6 is the air stability of the polymer of the present invention and the Comparative Examples. After 29 days, the loss of power conversion efficiency of the P6:PCBM was about 17%, the loss of power conversion efficiency of the Comparative Example 1 was about 56%, and the loss of power conversion efficiency of Comparative Example 2 was about 35%, showing that the stability of the polymer of the present invention was better.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A soluble polythiophene derivative of formula (I) or (II):

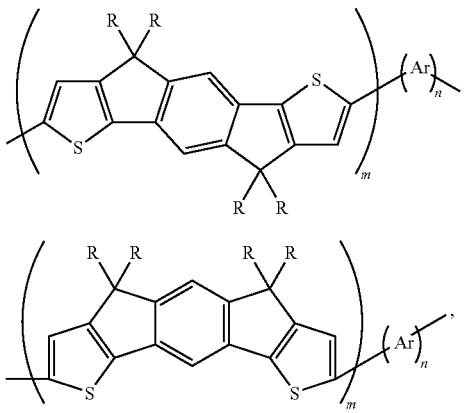

wherein R is hydrogen, alkyl, hydroxy, halogen, cyano (—CN), nitrous (—NO$_2$), amino, substituted or unsubstituted aryl, or substituted or unsubstituted oxadiazolopyridine, pyridopyrazine, benzooxadiazole, thiadiazolopyridine, selenophene, thiadiazoloquinoxaline, thienopyrazine, quinoxaline or diketopyrrolopyrrole;

Ar is substituted or unsubstituted arylene or thiadiazoloquinoxaline, thienopyrazine, quinoxaline or diketopyrrolopyrrole; and m and n are the numbers of repeating units, where m is an integer between 2 and 1000, and n is an integer between 0 and 100.

2. The soluble polythiophene derivative as claimed in claim 1, wherein the soluble polythiophene derivative has the formula (I).

3. The soluble polythiophene derivative as claimed in claim 1, wherein the soluble polythiophene derivative has the formula (II).

4. The soluble polythiophene derivative as claimed in claim 1, wherein the aryl comprises phenyl, naphthyl, diphenyl, anthryl, pyrenyl, phenanthryl or fluorene.

5. The soluble polythiophene derivative as claimed in claim 1, wherein n is larger than 1.

6. The soluble polythiophene derivative as claimed in claim 1, wherein n is 0.

7. The soluble polythiophene derivative as claimed in claim 1, wherein R is phenyl or alkylphenyl.

8. The soluble polythiophene derivative as claimed in claim 1, wherein the soluble polythiophene derivative has a Mw of about 1000-1,000,000.

9. The soluble polythiophene derivative as claimed in claim 1, wherein the soluble polythiophene derivative is used in an optoelectronic device.

10. The soluble polythiophene derivative as claimed in claim 9, wherein the optoelectronic devices are organic thin film transistors (OTFTs), organic light-emitting diodes (OLEDs), or organic solar cells (OSCs).

11. The soluble polythiophene derivative as claimed in claim 10, wherein the optoelectronic device is an organic thin film transistor (OTFT).

12. The soluble polythiophene derivative as claimed in claim 10, wherein the optoelectronic device is an organic light-emitting diode (OLED).

13. The soluble polythiophene derivative as claimed in claim 10, wherein the optoelectronic device is an organic solar cell (OSC).

* * * * *